(12) United States Patent
Laldin et al.

(10) Patent No.: US 11,953,524 B2
(45) Date of Patent: Apr. 9, 2024

(54) TOOL FOR ELECTRONICS TESTING AND DIAGNOSTICS

(71) Applicant: Gentiam LLC, Hermosa Beach, CA (US)

(72) Inventors: Omar Laldin, Hermosa Beach, CA (US); Tarryn MacPherson, Hermosa Beach, CA (US)

(73) Assignee: Gentiam LLC, Hermosa Beach, CA (US)

( * ) Notice: Subject to any disclaimer, the term of this patent is extended or adjusted under 35 U.S.C. 154(b) by 188 days.

(21) Appl. No.: 17/625,393

(22) PCT Filed: Jul. 9, 2020

(86) PCT No.: PCT/US2020/041352
§ 371 (c)(1),
(2) Date: Jan. 7, 2022

(87) PCT Pub. No.: WO2021/007405
PCT Pub. Date: Jan. 14, 2021

(65) Prior Publication Data
US 2022/0291257 A1    Sep. 15, 2022

Related U.S. Application Data

(60) Provisional application No. 62/872,171, filed on Jul. 9, 2019.

(51) Int. Cl.
*G01R 13/02*         (2006.01)
*G01R 1/02*          (2006.01)
(Continued)

(52) U.S. Cl.
CPC ......... *G01R 13/0227* (2013.01); *G01R 23/00* (2013.01)

(58) Field of Classification Search
CPC ........ G01R 13/02; G01R 23/00; G01R 31/02; G01R 31/26; G01R 31/28; G01R 31/302;
(Continued)

(56) References Cited

U.S. PATENT DOCUMENTS 3,906,437 A    9/1975    Brandwein et al.
4,608,657 A    8/1986    Manome et al.
(Continued)

FOREIGN PATENT DOCUMENTS

WO      9509481 A1    4/1995

OTHER PUBLICATIONS

Arduino S.R.L.: "Arduino UNO R3", Jun. 15, 2023 (Jun. 15, 2023), pp. 1-13, XP093055166, Retrieved from the Internet: URL:https://docs.arduino.cc/static/falf913df14dd3a42ad4e018bbd6d552/A000066-datasheet.pdf [retrieved on Jun. 16, 2023].
(Continued)

*Primary Examiner* — Neel D Shah
(74) *Attorney, Agent, or Firm* — Troutman Pepper Hamilton Sanders LLP; Ginger G. Turner

(57) ABSTRACT

A tool is presented herein capable of performing several electrical measurements and generating several electrical outputs. The tool can be configured to perform measurements and provide outputs most commonly utilized when developing and diagnosing failures of a hardware platform based around a microcontroller. The tool can have a form factor and a header configuration compatible for mating with an external microcontroller or minicomputer developer board such as Arduino, UDOO, Raspberry Pi, TI LaunchPad, STM Nucleo, BeagleBone, etc.

12 Claims, 6 Drawing Sheets

(51) Int. Cl.
*G01R 1/04* (2006.01)
*G01R 1/067* (2006.01)
*G01R 1/073* (2006.01)
*G01R 23/00* (2006.01)
*G01R 31/26* (2020.01)
*G01R 31/28* (2006.01)

(58) Field of Classification Search
CPC .......... G01R 31/319; G01R 1/02; G01R 1/04; G01R 1/067; G01R 1/073
See application file for complete search history.

(56) References Cited

U.S. PATENT DOCUMENTS

| | | | |
|---|---|---|---|
| 5,566,320 | A | 10/1996 | Hubert |
| 6,049,219 | A | 4/2000 | Hwang et al. |
| 6,956,387 | B2 | 10/2005 | Ho et al. |
| 7,191,368 | B1 * | 3/2007 | Organ ................. G01R 31/319 715/764 |
| 7,401,274 | B2 | 7/2008 | Parker |
| 7,709,750 | B2 | 5/2010 | Hashimoto et al. |
| 7,911,365 | B2 | 3/2011 | Cao et al. |
| 9,152,598 | B2 | 10/2015 | Fosse et al. |
| 9,431,133 | B2 * | 8/2016 | Gadlage ........... G01R 31/31907 |
| 9,632,133 | B2 * | 4/2017 | Chang ................ G01R 31/2815 |
| 2002/0135349 | A1 | 9/2002 | Steber et al. |
| 2004/0150383 | A1 | 8/2004 | Blais |
| 2007/0162796 | A1 | 7/2007 | Chan et al. |
| 2009/0128173 | A1 * | 5/2009 | Wong ................. G01R 31/2834 324/750.3 |
| 2012/0161881 | A1 | 6/2012 | Tung et al. |
| 2013/0054175 | A1 | 2/2013 | Saloio, Jr. et al. |
| 2013/0230991 | A1 | 9/2013 | Hampo et al. |

OTHER PUBLICATIONS

Arduino S.R.L.: "Arduino (TM) UNO Rev 3", Mar. 6, 2019 (Mar. 6, 2019), pp. 1-1, XP093055167, Retrieved from the Internet: URL:https://content.arduino.cc/assets/UNOTH_Rev3e_sch.pdf?_gl=1*1c3c6j2*_ga*ODAwMTMyODMyLjE2ODY5MDc3NDc.*_ga_NEXN8H46L5*MTY4NjkxMDY3Mi4yLjEuMTY4NjkxMjQw OC4wLjAuMA. [retrieved on Jun. 16, 2023].

Penev Milen: "Digital Multimeter Shield for Arduino", Apr. 21, 2014 (Apr. 21, 2014), pp. 1-32, XP093055169, Retrieved from the Internet: URL:https://content.instructables.com/pdfs/E16/XSKK/HUAXJQEW/Digital-multimeter-shield-for-Arduino.pdf [retrieved on Jun. 16, 2023].

Milen Penev: "Digital multimeter shield for Arduino", Apr. 21, 2014 (Apr. 21, 2014), XP093055121, Retrieved from the Internet: URL:https://www.youtube.com/watch?v=fWzSSaDfb7o [retrieved on Jun. 16, 2023].

Extended Search Report dated Jun. 27, 2023 issued in European Patent Application No. 20836918.1.

* cited by examiner

TOOL FOR ELECTRONICS TESTING AND DIAGNOSTICS

CROSS-REFERENCE TO RELATED APPLICATIONS

This application is a U.S. National Phase Application under 35 U.S.C. § 371 of International Patent Application No. PCT/US2020/041352 filed Jul. 9, 2020 which claims priority to U.S. Provisional Application No. 62/872,171 titled "DEVELOPMENT BOARD FOR ELECTRONICS TESTING AND DIAGNOSTICS" filed Jul. 9, 2019, each of which is incorporated by reference herein as if set forth in its entirety.

BACKGROUND

Development of electronic hardware typically requires an "electronics workbench" including several tools used for measurement of electronic signals (e.g. volt meters, current meters, oscilloscopes, data loggers, etc.), several tools used for generation of electronic signals (e.g. power supplies, waveform generators, etc.), several tools for constructing electrical circuits (e.g. bread boards, soldering tools, custom or customizable printed circuit boards, etc.), and discrete electrical components (e.g. resistors, capacitors, chips, sensors, connectors, etc.). When the electronic hardware under development includes a programmable processor, the electronics workbench can further include a computer to upload software to the hardware under development. The computer is typically also used in conjunction with the aforementioned collection of tools to test the hardware under development and diagnose software and/or hardware related issues.

The cost of assembling an electronics workbench with basic equipment (e.g. an introductory student bench), not including the cost of the computer, can be several hundreds to a few thousand dollars. A high end professional lab test bench can cost tens of thousands of dollars. Maintaining a reliable electronics workbench can also consume additional time and expense. For instance, maintaining diagnostic equipment in calibration is a requirement in many industries and applications. Typically, these devices are routinely sent out to external facilities that are able to provide calibration certificates. Due to cost and equipment downtime constraints, several pieces of handheld equipment, reserved for internal use, can be calibrated less frequently by an external entity and internal calibration tests can be sufficient.

During the development process, functionality of the hardware under test is tested and malfunctions are diagnosed through a "debugging" process. Inputs of the hardware under test can be controlled with known values using the electronic signal generation tools. Outputs of the hardware under test and other system electronics signals can be measured with the electronics signals measurement tools. Generally, such tools include probes or clip leads to touch or clamp onto conductors. In the case of probes, a user has to physically hold the probe in hand during measurement. Clip leads free up the hands but can be prone to fall off of the hardware under test. Further, debugging of the hardware under development can involve creating custom circuits to act as an interface between the electronic signal measurement tools and the hardware under test and/or as an interface between the electronic signal generation tools and the hardware under test. Configuring workbench equipment for debugging can therefore account for a significant amount of time in the hardware development process. Once configured for debugging, the workbench equipment is typically not easily portable and may not be accessible during field testing of the hardware under development.

Diagnostics of failed deployed hardware can therefore also be challenging and may require extraction of the hardware for testing on the workbench and/or mobilizing the work bench to the hardware's deployed location. Once the hardware and workbench are at the same physical location, the workbench and/or deployed hardware may further require a significant amount of time to reconfigure (e.g. reconstructing custom interface circuits, attaching clamps, accessing circuits to probe, etc.) before testing and diagnostics can be performed.

SUMMARY

A tool is presented herein capable of performing several electrical measurements and generating several common electrical outputs. The tool can be configured to perform measurements and provide outputs most commonly utilized when developing and diagnosing failures of a hardware platform based around a microcontroller. The tool can have a form factor and a header configuration compatible for mating with an external microcontroller or minicomputer developer board such as Arduino, UDOO, Raspberry Pi, TI LaunchPad, STM Nucleo, BeagleBone, etc. As used herein, the terms "microcontroller", "microcontroller development board", "microcontroller board", "microcontroller system", "external microcontroller", and "external system" are used interchangeably and are intended to include systems which do not boot an operating system such as the Arduino and also minicomputer systems which do boot an operating system.

An example electronics tool can include a waveform interface, an analog circuit interface, and/or a digital circuit interface. The waveform interface, analog circuit interface, and/or digital circuit interface can be integral to the electronics tool. The electronics tool can further include a display interface and/or a microcontroller interface. The display interface and/or microcontroller interface can be integral to the electronics tool. Each of the interfaces can be configured to make an electrical contact to one or more external systems that are non-integral to the tool. The tool can further include a processor and non-transitory computer readable medium in communication with instructions thereon that are executable by the processor. The tool can further include a printed circuit board ("PCB"). The interfaces and other components can be integral to the tool by virtue of being soldered or otherwise affixed to the PCB.

The waveform interface can include a waveform pin configured to make electrical contact with a system external to the electronics tool. The waveform interface can be configured to measure a frequency, amplitude, and/or a duty cycle of an electrical signal on the waveform pin. The waveform pin and the analog pin can be one in the same. The waveform interface can be configured to perform a Fourier Analysis on the electrical signal on the waveform pin. The waveform pin and the digital pin can be one in the same. The waveform interface can be configured to measure a frequency and a duty cycle of a pulse width modulated electrical signal on the waveform pin.

The analog circuit interface can include an analog pin configured to make electrical contact with a system external to the electronics tool. The analog circuit interface can be configured to provide an adjustable analog output at the analog pin, receive an analog input at the analog pin, and measure a magnitude of a voltage at the analog pin. The analog circuit interface further can include an analog connect switch. Functionality of the analog pin can toggle between an input and an output based at least in part on a position of the analog connect switch. The analog circuit interface can include a potentiometer. The adjustable analog output of the analog pin can be adjustable in response to manipulation of the potentiometer. The analog circuit interface can be configured to calibrate analog-to-digital conversion of the magnitude of the voltage at the analog pin.

The analog circuit interface can include solder connections, where each solder connection includes a solder pad, a solderable through-hole, or other such solderable connection. The analog circuit interface further can include a first solder connection electrically connected to the analog pin, a second solder connection electrically connected to a power supply pin, and a third solder connection electrically connected to a ground pin. The first, second, and third solder connections can be arranged within a grid of solder connections that can include additional solder connections. At least some of the additional solder connections can be electrically isolated from circuitry of the tool. The grid can have a width of at least two solder connections and a length of at least three solder connections. The grid can be larger to accommodate additional analog pins of the analog circuit interface and additional electrically isolated solder connections.

The digital circuit interface can include a mechanical switch and a digital pin. The digital pin can be configured to make electrical contact with a system external to the electronics tool. The digital circuit interface can be configured to provide a digital output at the digital pin based at least in part on a position of the mechanical switch. The digital circuit interface can be configured to receive a digital input at the digital pin.

The display interface can be configured to display an analog voltage value based on the magnitude of the voltage at the analog pin. The display interface can be configured to display a visual indication of the digital pin being at a high voltage or a low voltage. The display interface can be configured to display the analog voltage value and/or the digital pin being at the high voltage or the low voltage in alphanumeric characters (e.g. purely numeric characters, purely alphabetic, or a combination of letters and numbers). The display interface can include a segmented alphanumeric display. The display interface can include a light that illuminates when the digital pin is at the high voltage and darkens when the digital pin is at the low voltage.

The microcontroller circuit interface can include communication pins configured to make electrical contact with a system external to the electronics tool. The microcontroller circuit can be configured to communicate with an external processor of the system external to the electronics tool that is in electrical contact with the communication pins. The microcontroller circuit interface can be configured to communicate using inter-integrated circuit ("I2C") communication. The microcontroller circuit interface can be configured to function as a slave to the system external to the electronics tool and in contact with the communication pins. The microcontroller circuit interface can be configured to receive a transmitted value from the external processor and communicate the transmitted value to the display interface. The display interface is further configured to display the transmitted value.

The non-transitory computer readable medium in communication with the processor of the tool can include instructions thereon that when executed by the processor of the tool cause the tool to perform certain functions which can be carried out in various orders. The non-transitory computer readable medium can store, and the processor can execute, all values and instruction sets utilizing these values, pertaining to the various interfaces as necessary. As an example, the instructions can cause the tool to receive the magnitude of the voltage at the analog pin, cause an alphanumeric representation of the magnitude of the voltage at the analog pin to be displayed at the display interface, receive the transmitted value from the external processor, and/or cause an alphanumeric representation of the transmitted value to be displayed at the display interface. The instructions can cause the tool to sense a temperature of the tool and cause an alphanumeric representation of the temperature to be displayed at the display interface.

The processor can have a clock speed. The tool can be configured to calibrate the clock speed based on an external square wave signal.

The display interface can include one or a plurality of mechanical buttons integral to the tool. The non-transitory computer readable medium can include instructions thereon that when executed by the processor of the tool cause the processor to receive an electrical signal in response to a press of the one or a plurality of mechanical buttons and cause the display interface to toggle between displaying the alphanumeric representation of the magnitude of the voltage at the analog pin, the frequency of the electrical signal on the waveform pin, the duty cycle of the electrical signal on the waveform pin, and/or alphanumeric representations of other measured signal values when the mechanical button(s) is pressed.

The PCB can be single-sided. The PCB can have a maximum linear dimension of about 150 millimeters (mm) or less. The digital pin can include a male connector and a female connector extending from an opposite side of the PCB from the respective male connector. The analog pin can similarly have a male and female connector. Two rows of headers can be affixed to the PCB that are substantially parallel to each other and spaced about 50 millimeters ("mm") apart as measured orthogonal to the header rows. Each of the header rows can include pins that each have a male connector an oppositely extending female connector similar to the digital pin. The digital pin and analog pins can be respectively positioned in separate header rows of the two parallel header rows.

DETAILED DESCRIPTION

Figure 1:
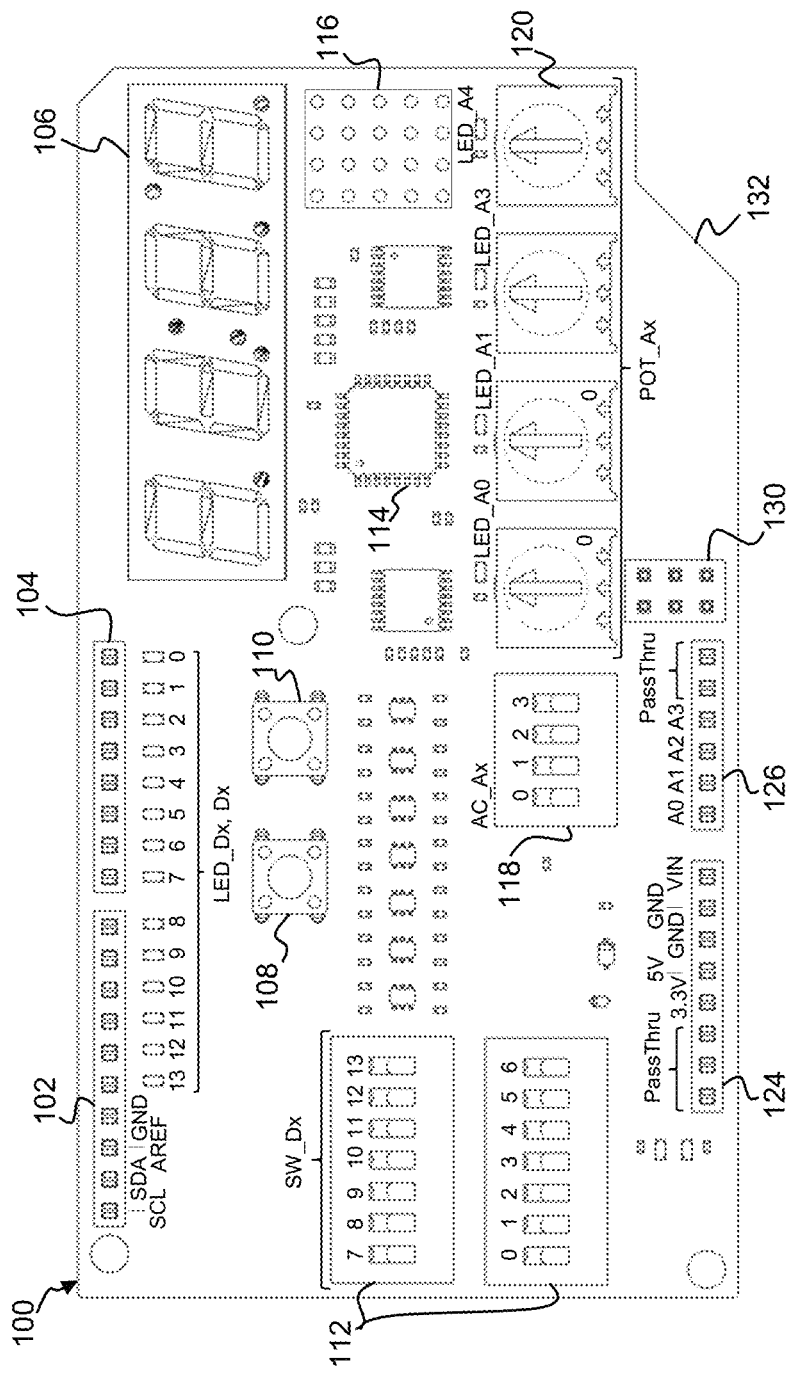
FIG. 1 is a plan front view of an example tool for electronics testing and diagnostics according to aspects of the present invention.
Figure 2:
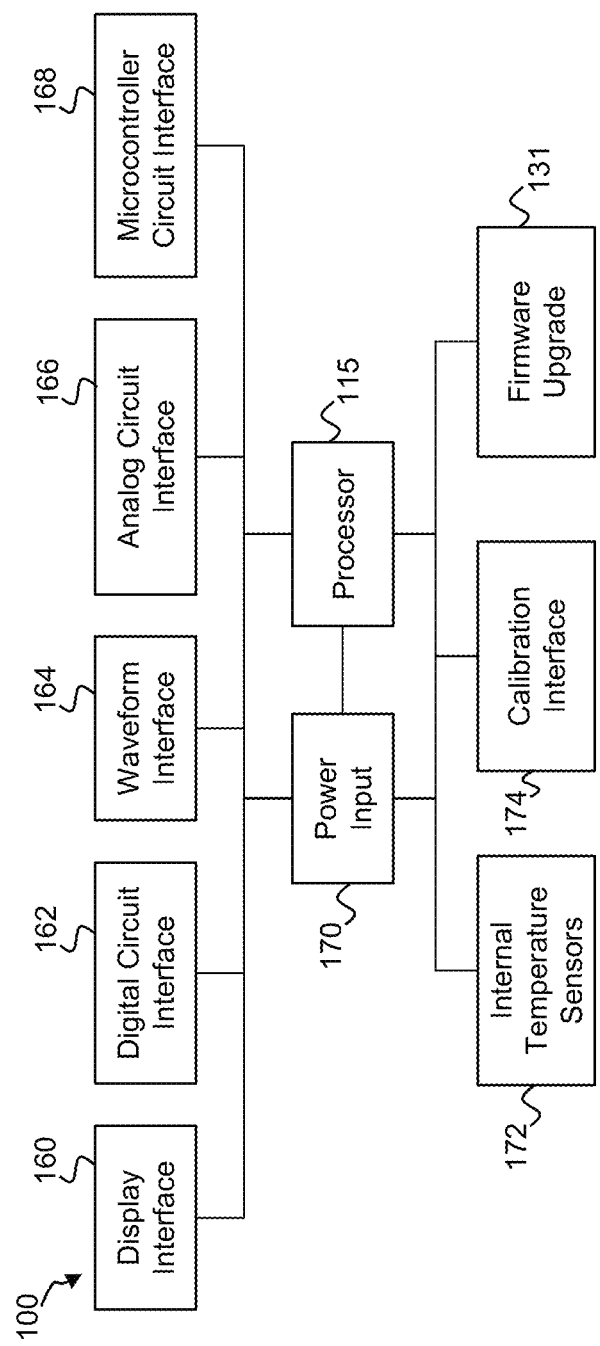
FIG. 2 is a block diagram illustrating functional blocks of the example tool.

FIG. 1 is a plan front view of an example tool 100 for electronics testing and diagnostics. FIG. 1 illustrates a specific implementation of the tool 100. Several variations thereof are contemplated including, but not limited to, more or fewer components, substitute components, alternative component orientations and configurations, alternative overall form factor, etc. FIG. 2 is block diagram illustrating some potential functional blocks of the tool 100. The functional blocks illustrated in FIG. 2 can be realized in many different ways, including the specific implementation of the tool 100 illustrated in FIG. 1. As illustrated in FIG. 2, the tool 100 can include a power input 170, a display interface 160, a digital circuit interface 162, a waveform interface 164, an analog circuit interface 166, a microcontroller circuit interface 168, a calibration interface 174, a processor 115 in communication with each of the aforementioned interfaces. The tool 100 can include thermocouples, thermistors, or other temperature sensors positioned to measure PCB 132 temperature, processor chip 114 temperature, and/or temperature of other components of interest as part of the internal temperature sensors 172. The tool 100 can include a firmware upgrade block 131 (FIG. 2) which includes a programming port 130 (FIG. 1) to facilitate firmware upgrades to the processor chip 114.

Some or all of the functional blocks 160, 162, 164, 166, 168, 170, 172, 174, 131 can include software and/or firmware that is executable by the processor 115 to perform functions associated with that functional block. The tool 100 can therefore include non-transitory computer readable medium ("memory") to store instructions related to some or all of the functional blocks. The tool 100 illustrated in FIG. 1 includes such memory and the processor 115 (FIG. 2) in a processor chip 114. The memory can be centralized as illustrated in FIG. 1 or can be separated on multiple chips or other components. From a perspective of functionality as illustrated in FIG. 2, a single software and/or firmware module in the memory can be associated with one (or more) functional block(s) 160, 160, 164, 166, 168, 170, 172, 174, 131 regardless of where such software and/or firmware is physically located in memory. The tool 100 can further include an internal temperature sensors 172 in communication with the processor 115. The tool 100 can additionally include a top-level software to manage operations of the processor 115, and/or other software or firmware to facilitate functionality of the tool 100 as understood by a person skilled in the pertinent art according to the teachings herein.

For the sake of illustration, the power input 170, display interface 160, digital circuit interface 162, waveform interface 164 and analog circuit interface 166 are not labeled in FIG. 1; however, each can be understood as including respective subsets of component parts of the tool 100 illustrated in FIG. 1 as described in greater detail below. Further, individual components of the tool 100 (e.g. pins, chips, resistors, capacitors, circuit traces, memory, software programs, etc.) can provide functionality for multiple functional blocks. Specifically, in the example implementation of the tool 100 illustrated in FIG. 1, the waveform interface 164 can share pins common to the analog circuit interface 166 and/or digital circuit interface 162.

Specific example implementations of the tool 100 can include more or fewer functions as understood by a person skilled in the pertinent art according to the teachings herein. For an example implementation of the tool 100 including the display interface 160, the tool 100 can include at least one of the digital circuit interface 162, waveform interface 164, analog circuit interface 166, microcontroller circuit interface 168, internal temperature sensors 172, calibration interface 174, or other interface which can provide data to display at the display interface 160 or send it to an external system or microcontroller. The digital circuit interface 162, waveform interface 164, analog circuit interface 166, and microcontroller circuit interface 168 can be implemented such that each respective interface can act alone, without requiring the tool 100 to include another one of the interfaces 162, 164, 166, 168 or the display interface 160. In some examples, the tool 100 can include internal temperature sensors 172, calibration interface 174, and/or firmware upgrade 131 functional blocks.

Examples of additional functions which can be included in the tool include, but are not limited to, on-board storage (e.g. microSD, etc.), wireless communication functionality (e.g. Bluetooth, etc.), a RESET push-button that power cycles the tool 100, support for high voltage analog inputs and outputs like 12, 24, 48V, etc. (e.g. voltages usable for automotive diagnostics), and/or other functionality as understood by a person skilled in the pertinent art according to the teachings herein. Such additional functionality can be integral to the tool 100 and/or the tool 100 can be configured to readily receive additional, detachable hardware to facilitate such additional functionality. As illustrated in FIG. 1, the tool 100 has headers 102, 104, 124, 126 configured to receive a shield compatible with Arduino. Additional functionality can be directly affixed to a printed circuit board (PCB) 132 of the tool 100 and/or can be included on a compatible shield. Herein, "shield" refers to a mechanically compatible PCB that may be mounted on to and/or mated with the tool 100.

Some or all of the functional blocks illustrated in FIG. 2 can be integral to the tool 100, where the term "integral to" as used herein is understood to mean affixed in a permanent or semi-permanent manner to the tool 100. As illustrated, the functional blocks illustrated in FIG. 2 are "integral to" the tool 100 by virtue of having components necessary to execute functions of the functional blocks affixed with solder and/or otherwise bonded to a common printed circuit board 132. Alternatively, circuitry necessary for functional blocks of the tool 100 can be divided onto multiple printed circuit boards and such circuitry can be "integral to" the tool 100 by virtue of being packaged in a common housing (e.g. similar to how circuit components can be packaged inside typical electronics workbench equipment).

The tool can include memory configured to store instructions that are executable by the processor 115 as well as memory configured to store measured values or other information or instructions. Such memory can include non-transitory computer readable medium. As used herein, the term "non-transitory computer-readable media" includes, but is not limited to, random access memory ("RAM"), read-only memory ("ROM"), electronically erasable programmable ROM ("EEPROM"), flash memory or other memory technology, compact disc ROM ("CD-ROM"), digital versatile disks ("DVD") or other optical storage, magnetic cassettes, magnetic tape, magnetic disk storage or other magnetic storage devices, or any other tangible, physical medium which can be used to store computer readable information.

In the present example, the tool 100 can provide commonly used functionally of several individual pieces of electronics workbench equipment at a small fraction of the cost of the combination of the electronics workbench equipment. Electronics workbench equipment are generally designed as either for measurement of electronic signals or generation of electronic signals, but not for both. In the present example, the tool can function both (an in some instances equally) as tool for measurement of electronic signals received by the tool 100 and for generation of electronic signals output from the tool 100. As illustrated, these features can be integrated into a low-cost, single-sided PCB 132. Configured as such, the tool 100 can therefore also be more portable than the combination of electronics workbench equipment.

The form factor and the cost of the tool 100 can allow the tool 100 to facilitate testing and diagnostics of deployed hardware. Measurement data from typical diagnostics equipment and other data acquisition systems is generally only available during the development and prototype validation phases, when the hardware under development is being designed and is set up on a test bench. Such equipment substantially increases the cost and complexity of the system itself, prohibiting availability of data during run-time. When measured data is required during run-time, specific subsystems need to be designed and integrated into the overall system, increasing development cost and time. In some examples, the tool 100 can easily and affordably be integrated into the hardware as deployed and function as a data acquisition system that can transmit measured data values.

Having the form factor illustrated in FIG. 1, the tool 100 can mate to an external microcontroller board 200 (see FIG. 6) such as an Arduino or other such product having an Arduino-compatible header configuration. As illustrated in FIG. 1, the tool 100 can include a first row of headers 102, 104 spaced about 50 mm from a second row of headers 124, 126, and the headers can each respectively have a pin configuration that is Arduino-compatible. The tool 100 can be connected to a microcontroller or computing products such as UDOO, Raspberry Pi, TI LaunchPad, STM Nucleo, BeagleBone, etc., including those not having an Arduino-compatible header configuration, using jumpers and/or an intermediate adapter board. In another example, the tool 100 can have some or all of the functionality disclosed herein and be compatible to mate with a microcontroller or mini-computer development board having an alternate header or connector configuration (e.g. specific to one or more of UDOO, Raspberry Pi, TI LaunchPad, STM Nucleo, Beagle-Bone, etc.).

The following disclosure describes technical aspects of the tool 100 and component parts beginning with the display interface 160, which provides an overview of values that can be measured and displayed by the tool. Then specifics of each of the digital circuit interface 162, waveform interface 164, analog circuit interface 166, and microcontroller circuit interface 168, and calibration interface 174 are presented in that order. Following the description of component parts, example advantages and use cases are discussed, including the tools' potential ability to integrate easily with external systems.

Display Interface 160

The display interface 160 can function to display values associated with the digital circuit interface 162, the analog circuit interface 166, the microcontroller circuit interface 168, the internal temperature sensors 172, calibration interface 174, and/or other interfaces not illustrated. The display interface 160 as illustrated includes on-board display 106 and push buttons 108, 110 configured to cycle the on-board display 106 through a series of values received from the waveform interface 164, the analog circuit interface 166, the microcontroller circuit interface 168, the internal temperature sensors 172, calibration interface 174, and/or other interfaces not illustrated. The push buttons 108, 110 can be configured to cycle through the series of values in opposite order or can be otherwise configured as understood by a person skilled in the pertinent art.

The processor 115 can be configured to retrieve the series of values from the waveform interface 164, the analog circuit interface 166, the internal temperature sensors 172, the calibration interface 174, and/or the microcontroller circuit interface 168 and provide them to the display interface 160. For instance, the memory (integrated into the processor chip 114 as illustrated) can include instructions that when executed by the processor 115, cause the processor 115 to retrieve the series of values and provide them to the display interface 160 to be displayed on the on-board display 106.

As illustrated, the display interface 160 further includes light emitting diodes ("LEDs", LED_Dx, where x is the number of the individual LED) configured to illuminate to indicate high or low values of digital pins (Dx, where x is the number of the individual digital pin) of the digital circuit interface 162. Optionally, the display interface 160 can further be configured to display values from the digital circuit interface 162 via the on-board display 106 using the push buttons 108, 110. However, the high or low status of the digital pins (Dx) of the digital circuit interface 162 can more readily be visible via the LEDs (LED_Dx) present on each digital pin (Dx) of the interface as described in greater detail in reference to FIG. 3. Further, adding values from the digital circuit interface 162 to the series of values displayed by the on-board display 106 can increase number of button pushes a user makes to navigate to a value of interest using the push buttons 108, 110.

In some examples, the display interface 160 further includes LEDs configured to illuminate in response to respective signals on waveform pins of the waveform interface 164. Illumination of an LED on a respective pin can indicate a presence of a signal on a respective waveform pin. Brightness of an LED on a waveform pin can provide a visual indication of duty cycle and/or amplitude of a respective signal on the waveform pin. As discussed in further detail below, some or all of the waveform pins and LEDs can be co-existent with some or all of the digital pins (Dx) and LEDs (LED_Dx).

As illustrated, the display interface 160 further includes LEDs (LED_Ax, where x is the number of the individual LED) configured to illuminate to provide a visual indication of open or closed status of a switch (AC_Ax, where x is the number of the individual switch) associated with an analog pins (Ax, where x is the number of the individual pin) of the analog circuit interface 166. The function of the switch (AC_Ax) is described in greater detail in relation to FIG. 4.

The display interface 160 can additionally, or alternatively, include other displays and user interfaces as are known in the art or are yet to be developed. The illustrated seven segment on-board display 106 and push buttons 108, 110 are a low-expense option. Examples of other known displays and user inputs which could provide similar functionality (likely at greater cost) include a touch screen, a color screen with hard coded and/or soft button selection, scroll wheel, mouse track pad, numerical keyboard, qwerty keyboard, and the like as understood by a person skilled in the pertinent art. Display technology which can be utilized includes, but is not limited to, organic LED ("OLED"), hex digit display ("HEX"), liquid crystal diode ("LCD"), thin film transistor LCD ("TFT"), LED, plasma display panel, electronic paper, digital light processing ("DLP") display, and other displays with similar functionality.

As illustrated in FIG. 1, components (i.e. switches AC_Ax, SW_Dx and potentiometers POT_Ax) for controlling outputs for the analog circuit interface 166 and digital circuit interface 162 are described as included in their respective interfaces 162, 166 and not part of the display interface 160. Position of such components is visible and therefore can be used to visualize user settings. The display interface 160 provides a visual indication of an electrical signal, which can be compared against the user inputs visible based on switch and/or potentiometer position. Because the switches AC_Ax, SW_Dx, and potentiometers POT_Ax are related to user input rather than display of measured values, those components are not described as included in the display interface 160. The seven segment on-board display 106 and push buttons 108, 110 need not be configured to receive user input, and therefore these components can be exclusive to the display interface 160. However, were the on-board display 106 and push buttons 108, 110 replaced by display and user interface with user input capabilities, such a display and user input may provide functionality of the display interface 160 and other interfaces and internal sensors 162, 164, 166, 168, 172, 174.

The illustrated display interface 160 allows for navigation using a left push button 108 and a right push button 110. The push buttons 108, 110 allow the user to scroll through various channels providing measurement and external system memory values of interest. The on-board display 106 includes four seven-segment display digits, where each digit can display an alphanumeric character including numbers 0 through 9 and some letters. The display interface 160 can be configured to display, on the on-board display 106, an indication of the channel being observed, the value associated with the channel, and/or messages for the user.

In some examples, the display interface 160 can display and cycle through such information according to a context menu. The context menu can be stored in memory accessible by the processor 115 so that the processor 115 can cycle through the context menu in response to user interaction with the push buttons 108, 110.

In some examples, channels in the context menu can be arranged sequentially. For instance, a first set of channels can be associated with the analog circuit interface 166, a second set of channels can be associated with the waveform interface 164, and a third set of channels can be associated with the microcontroller circuit interface 168. The context menu can further include a channel for on-board temperature measurement. In some examples, additional channels associated with additional interfaces may be added.

Table 1 includes an example configuration of a context menu. In the illustrated example, the analog measurement channels display the measured values for analog pins (Ax) from the analog circuit interface 166. The tool 100 can measure the frequency and duty cycle of waveform interface pins (e.g. PWM-enabled digital pins Dx and/or analog pins Ax enabled with Fourier Transform) from the waveform interface 164; their measurements can be provided in the PxF (for frequency) and Pxd (for duty cycle) channels (where x defines the digital pin number), respectively. The tool 100 can display user defined variable channels (Ux, where x defines the user variable number) from the microcontroller circuit interface 168. The on-board temperature is displayed in a single channel (t0). The on-board temperature can be measured by a temperature sensor affixed to the PCB 132. In some examples, the tool 100 can further include a temperature sensor positioned to measure temperature of the processor chip 114, which can be displayed on a second temperature channel (t1).

TABLE 1

Example context menu channel listing.

| Ch. # | Ch. Name | Measurement | Units |
|---|---|---|---|
| 0 | A0 | A0 voltage | V |
| 1 | A1 | A1 voltage | V |
| 2 | A2 | A2 voltage | V |
| 3 | A3 | A3 voltage | V |
| 4 | P3d | P3 duty cycle | % |
| 5 | P3F | P3 frequency | Hz |
| 6 | P5d | P5 duty cycle | % |
| 7 | P5F | P5 frequency | Hz |
| 8 | P6d | P6 duty cycle | % |
| 9 | P6F | P6 frequency | Hz |
| 10 | P9d | P9 duty cycle | % |
| 11 | P9F | P9 frequency | Hz |
| 12 | P10d | P10 duty cycle | % |
| 13 | P10F | P10 frequency | Hz |
| 14 | P11d | P11 duty cycle | % |
| 15 | P11F | P11 frequency | Hz |
| 16 | U0 | user variable 0 | — |
| 17 | U1 | user variable 1 | — |
| 18 | U2 | user variable 2 | — |
| 19 | U3 | user variable 3 | — |
| 20 | U4 | user variable 4 | — |
| 21 | U5 | user variable 5 | — |
| 22 | U6 | user variable 6 | — |
| 23 | U7 | user variable 7 | — |
| 24 | U8 | user variable 8 | — |
| 25 | U9 | user variable 9 | — |
| 26 | t0 | On-board temperature | ° C. |
| 27 | t1 | On-chip temperature | ° C. |

Digital Circuit Interface 162

The digital circuit interface 162 includes digital pins (Dx) and physical switches (SW_Dx) referred to hereafter as "digital switches". Digital pins (Dx) can be realized in several forms of hardware including pin headers, screw terminals, terminal blocks, zero-insertion force ("ZIF") socket connectors, polarized connectors, crimp connectors, spring terminals, clincher connectors, and the like as understood by a person skilled in the pertinent art. As illustrated in FIG. 1, the digital pins (Dx) are included in two headers 102, 104 near an upper edge of the PCB 132. The digital switches (SW_Dx) can be realized in several forms of hardware including toggle switches, DIP switches, single in-line package switches, zig-zap in-line package switches, rotary switches, push-button switches, slide switches, single-pole single-throw switches, single-pole double-throw switches, double-pole single-throw switches, double-pole double-throw switches, limit switches, joystick switches, all similar categories of relays, solenoids, actuators, etc., and the like as understood by a person skilled in the pertinent art. Further, some or all of the digital switches (SW_Dx) can be replaced with push buttons and/or push buttons can be added in parallel or series with some or all of the digital switches (SW_Dx). In some examples, as illustrated in FIG. 1, the digital switches (SW_Dx) are included in two dual in-line package ("DIP") switches 112 near the left edge of the PCB 132. A DIP switch is a type of mechanical switch. In some uses of the tool 100, the ability to control a digital output with a mechanical switch (rather than through a software interface) can provide ease of use as no additional computing device or navigation through a software interface are needed. One may readily flip the switch (SW_Dx) to directly control the associated digital pin (Dx).

In some examples, the digital pins may be isolated from the external system through the use of isolation circuitry, employing components such as opto-couplers, opto-isolators, photo-couplers, etc., using optical isolation, isolation transformers, solenoids, relays, etc., using inductive isolation, capacitive isolators, isolating amplifiers, and the like as understood by a person skilled in the pertinent art.

The digital pins (Dx) can be configured as input/output ("i/o") pins. The digital switches (SW_Dx) can be configured to provide a voltage value evaluated as a logical "high" (read by an external system or processor as a 1), or a voltage value evaluated as a logical "low" (read by an external system or processor as a 0), to individual digital pins (Dx). The numerical value of the voltages considered high or low may vary in different microcontroller systems. LEDs of the display interface 160 configured to provide a visible indication of the digital pins (Dx) are referred to herein as "digital LEDs". The digital LEDs (LED_Dx) are positioned adjacent the digital pins (Dx) to indicate voltage at the respective adjacent digital pin (Dx).

As illustrated, the digital switches (SW_Dx) are arranged in two rows of seven DIP switches. The digital pin (Dx) connected to each digital switch (Dx) in the present example is indicated in Table 2. The digital pin connection can also be indicated on the tool (e.g. printed one printed circuit board "PCB", printed or molded on the switches, molded on the header, etc.).

TABLE 2

Digital Switch and Digital Pin connections.

| Switch | Pin |
|---|---|
| Bottom row, switch 1 | D0 |
| Bottom row, switch 2 | D1 |
| Bottom row, switch 3 | D2 |
| Bottom row, switch 4 | D3 |
| Bottom row, switch 5 | D4 |
| Bottom row, switch 6 | D5 |
| Bottom row, switch 7 | D6 |
| Top row, switch 1 | D7 |
| Top row, switch 2 | D8 |
| Top row, switch 3 | D9 |
| Top row, switch 4 | D10 |
| Top row, switch 5 | D11 |
| Top row, switch 6 | D12 |
| Top row, switch 7 | D13 |

Digital LEDs (LED_Dx) for digital pins (Dx) are located next to the header 102, 104 associated to each pin. The digital LEDs (LED_Dx) will turn on when the digital pin (Dx) is driven high regardless of the source (an external signal or the digital switch SW_Dx).

Figure 3:
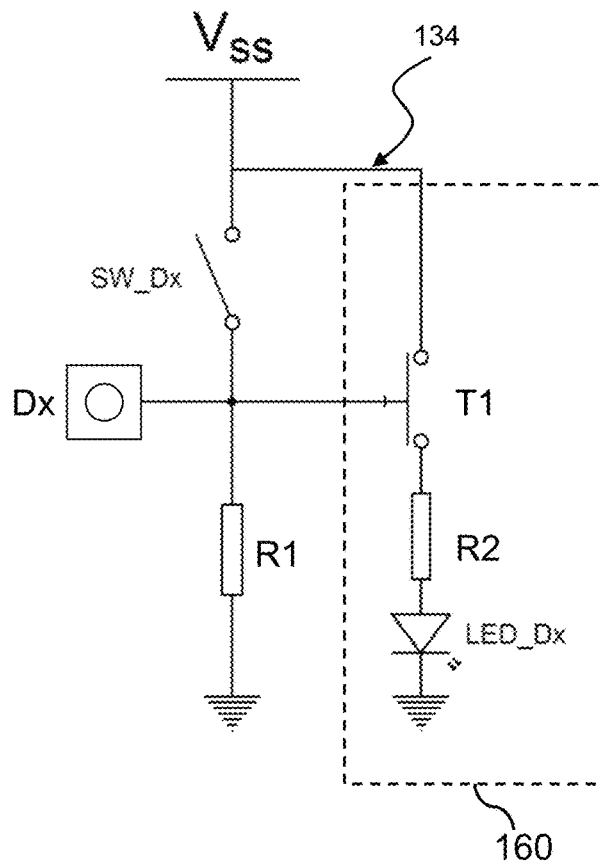
FIG. 3 is a circuit diagram of a portion of a digital circuit interface of the example tool.

FIG. 3 is a circuit diagram illustrating functionality of the tool 100 in relation to the digital pins (Dx) of the digital circuit interface 162. The illustrated circuit 134 includes the respective digital switch (SW_Dx) connected to the digital pin (Dx), the respective digital LED (LED_Dx) driven by a transistor (T1), with its control signal connected to the digital pin (Dx). The illustrated circuit 134 also includes the current-limiting resistor (R1) and the pull-down resistor (R2). The digital switch (SW_Dx), digital pin (Dx), and current-limiting resistor (R1) are part of the digital circuit interface 162. The transistor (T1), digital LED (LED_Dx), and pull-down resistor (R2) are part of the display interface 160 as their presence does not provide functionality to the digital circuit interface 162 other than to provide a visual indication of the voltage at the respective digital pin (Dx).

When an external system connected at the digital pin (Dx) is configured to receive digital signals, the digital circuit interface 162 is capable of driving the output of respective pins to a high or low voltage output based on the status of the respective digital switch (SW_Dx) as closed or open. Each respective switch is connected in an "OR" configuration with the respective digital pin (Dx) such that, when the digital switch (SW_Dx) is set to open, the digital circuit interface 162 can receive signal inputs to the digital pin (Dx) from an external source. Regardless of the source, when the gate of the transistor (T1) is driven high, the transistor (T1) completes the circuit to cause the respective digital LED (LED_Dx) to illuminate. When the gate of the transistor (T1) is driven low, the transistor (T1) opens the circuit to cause the respective digital LED (LED_Dx) to darken.

The supply voltage (Vss) is preferably a standard voltage used for digital logic circuits such as 5 V or 3.3 V. The supply voltage (Vss) can be obtained from the voltage provided at the power input of the tool 100 and/or a voltage regulator of the tool 100 as understood by a person skilled in the pertinent art. As illustrated in FIG. 1, the tool 100 can include a 3.3V pin, a 5V pin, a ground (GND) pin, and an input voltage (VIN) pin in a header 124 near the lower edge of the PCB 132. In some examples the input voltage (VIN) pin can be a pass-through pin and not used to obtain the supply voltage (Vss). The tool 100 can include a reference voltage pin (AREF) and another ground (GND) pin in one of the headers 102 near the upper edge of the PCB 132. In some examples the reference voltage pin (AREF) can be a pass-through pin and not used to obtain the supply voltage (Vss). The tool 100 can include additional or alternative power-related inputs as understood by a person skilled in the pertinent art. The low voltage (illustrated by the ground symbol) and the supply voltage (Vss) can be based on some or all of these voltage input pins including combinations thereof. For many applications, it can be sufficient for the digital pins (Dx) to share a common voltage source (Vss) with each other, but they need not share a common voltage source (Vss).

Waveform Interface 164

The waveform interface 164 can include circuitry in communication with the processor 115 so that the frequencies PxF and duty cycles Pxd can be displayed on the on-board display 106 of the display interface 160. The circuitry can include hardware and/or software to achieve frequency and/or duty cycle measurements as described herein. There are various means for implementing such circuitry and/or software as apparent to a person skilled in the pertinent art according to the teachings herein and are intended to be within the scope of the present disclosure. Specifically, as illustrated in FIG. 1, the waveform interface 164 includes circuitry to deliver waveforms from some of the digital pins (D3, D5, D6, D9, D10, D11) to the processor chip 114 and software stored in memory of the processor chip 114 to determine frequencies PxF and duty cycles Pxd of the delivered waveforms. Additionally, or alternatively, the waveform interface 164 can include circuitry to deliver waveforms from some of the analog pins (Ax) to the processor chip 114 and software stored in memory of the processor chip 114 to determine frequencies, amplitudes, duty cycles, and/or other values of interest of the delivered waveforms. The waveform interface 164 can be configured to perform a Fourier transform on waveforms present on the analog pins (Ax) in order to determine the frequencies, amplitudes, and/or duty cycles.

In some examples, the waveform interface 164 is configured to measure and display PWM signals having frequencies from about 123 Hertz ("Hz") up to about 2.45 kHz. In some examples, the waveform interface 164 is configured to measure and display PWM signals having frequencies up to about 3 kHz. Once a PWM signal is applied to a waveform pin, the display interface 160 can be used to navigate to the appropriate frequency display channel. In some examples, the waveform interface 164 can be configured to initiate the frequency measurement process upon navigation to the frequency display channel. The tool 100 can be configured to obtain the measurement frequency measurement (PxF) and display it on the on-board display 106. If the frequency is above or below allowable limits of the tool 100, the on-board display 106 can be configured to display an overflow or underflow error. As illustrated in FIG. 1, the overflow and underflow error can be displayed as a few characters on the seven segment display. The overflow and underflow error can be displayed in a multitude of manners using an alternative display as understood by a person skilled in the pertinent art.

In some examples, the waveform pins may be isolated from the external system through the use of isolation circuitry, employing components such as opto-couplers, opto-isolators, photo-couplers, etc., using optical isolation, isolation transformers, solenoids, relays, etc., using inductive isolation, capacitive isolators, isolating amplifiers, and the like as understood by a person skilled in the pertinent art.

PWM duty cycle measurements can be displayed on the on-board display 106 in the duty cycle (Pxd) channels of the display interface 160 as a percentage. In some examples, the waveform interface 164 can be configured to measure duty cycles from about 5% to about 95% or from about 2% to about 98%. Once a PWM signal is applied to a respective waveform pin, the display interface 160 can be used to navigate to the appropriate duty cycle display channel (Pxd). In some examples, the waveform interface 164 can be configured to initiate the duty cycle measurement process upon navigation to the duty cycle display channel (Pxd). The waveform interface 164 can be configured to obtain the duty cycle measurement and provide it to the display interface 160 for display on the on-board display 106. If the duty cycle is above or below allowable limits, the display interface 160 can be configured to display an overflow or underflow error on the on-board display 106.

In the present example, pins of the waveform interface 164 can also function as digital pins (Dx) of the digital circuit interface 162. The configuration is particularly suited for waveforms that toggle between the high and low voltage values of the digital pins (Dx) of the digital circuit interface 162, for example PWM signals. For instance, a subset of the digital pins (D3, D5, D6, D9, D10, D11) can function as part of the digital circuit interface 162 and the waveform interface 164. When configured as such, in addition to circuitry to measure frequency (PxF) and duty cycle (Pxd), respective pins of the waveform interface 164 can include circuitry as illustrated in FIG. 3. The respective components (SW_Dx, Dx, T1, R1, R2, LED_Dx) function as described in relation to FIG. 3 when no waveform signal is being applied. Circuitry to measure frequency PxF and duty cycle (Pxd) can be connected to the respective digital pin (Dx). When the digital switch (SW_Dx) is open, circuitry in FIG. 3 and circuitry to enable measurements of frequencies (PxF) and duty cycles (Pxd) of signals on the waveform pins can be driven by a waveform signal input to the waveform/digital pin (D3, D5, D6, D9, D10, D11). The waveform signal can cause the transistor (T1) to open and close according to the frequency and duty cycle of the waveform signal, thereby causing light output of the LED (LED_D3, LED_D5, LED_D6, LED_D9, LED_D10, LED_D11) to blink and/or appear to change in brightness accordingly.

Alternatively, a waveform pin not configured to function as a digital input interface 162 pin can be connected to a circuit with the LED indicator (LED_Dx). In this case, the circuit can include the transistor (T1) and associated current limiting resistor (R2) but lack the digital switch (SW_Dx) and its associated pull down resistor (R1). The digital switch (SW_Dx) illustrated in FIG. 3 is therefore part of the digital circuit interface 162 and not the waveform interface 164. The transistor (T1), LED (LED_Dx), and associated resistor (R2) are part of the display interface 160. The waveform interface 164 can include circuitry, memory, and software, and is in communication with the processor 115, which can read the frequencies PxF and duty cycles Pxd from said interface, allowing the processor 115 to send the data to the display interface 160 (to be displayed) and/or the microcontroller circuit interface 168 (to externally transmit the data). Such circuitry can be realized using known or yet to be developed techniques as understood by a person skilled in the pertinent art.

Analog Circuit Interface 166

The analog circuit interface 166 includes analog pins (Ax), potentiometers (POT_Ax, where x indicates the number of the individual potentiometer) to control an adjustable analog voltage output to analog pins (Ax) of the analog circuit interface 166, and physical switches (herein referred to as "analog connect switches" AC_Ax, where x indicates the number of the individual analog connect switch) to toggle individual analog pins (Ax) between input and output mode.

The analog pins (Ax) are illustrated as being part of a header 126 near the lower edge of the PCB 132. The analog pins (Ax) can be realized in several forms of hardware including pin headers, screw terminals, terminal blocks, ZIF socket connectors, polarized connectors, crimp connectors, spring terminals, clincher connectors, and the like as understood by a person skilled in the pertinent art. The potentiometers (POT_Ax) are illustrated as each having a knob that can be turned to vary the position of the middle contact of each potentiometer respectively. The adjustable voltage output functionality of the potentiometers (POT_Ax) can be realized in several forms of hardware including mechanical potentiometers, digital potentiometers, rheostats, dc-dc converters, and the like, as well as circuitry configured to provide adjustable voltage output, containing variable capacitors or condensers, variacs, transformers, and the like, as understood by a person skilled in the pertinent art. The analog connect switches (AC_Ax) are illustrated as DIP switches 118 near the header 126 of the analog pins (Ax) and the row 120 of potentiometers (POT_Ax). The analog connect switches (AC_Ax) can be realized in several forms of hardware including toggle switches, DIP switches, single in-line package switches, zig-zap in-line package switches, rotary switches, push-button switches, slide switches, single-pole single-throw switches, single-pole double-throw switches, double-pole single-throw switches, double-pole double-throw switches, limit switches, joystick switches, all similar categories of relays, solenoids, actuators, etc., and the like as understood by a person skilled in the pertinent art.

In some examples, the analog pins may be isolated from the external system through the use of isolation circuitry, employing components such as opto-couplers, opto-isolators, photo-couplers, etc., using optical isolation, isolation transformers, solenoids, relays, etc., using inductive isolation, capacitive isolators, isolating amplifiers, and the like as understood by a person skilled in the pertinent art.

Figure 4:
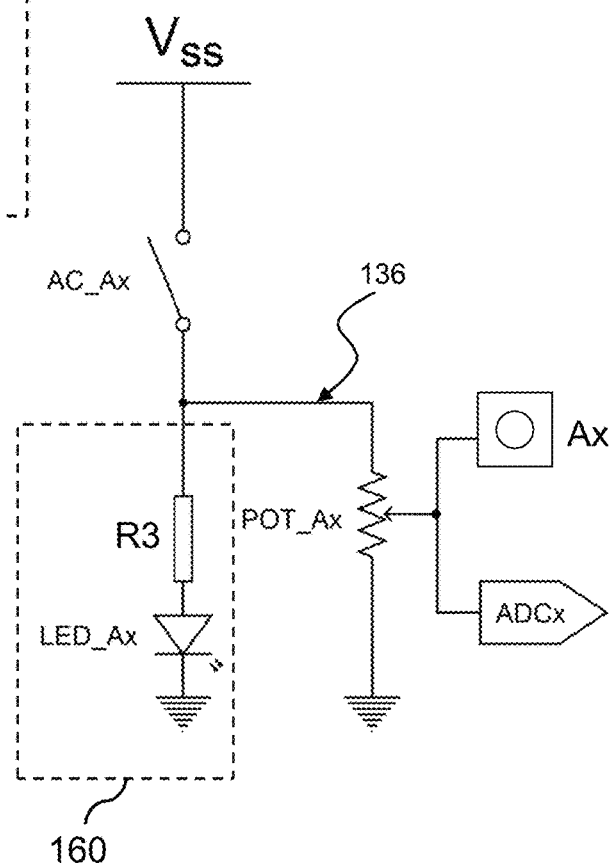
FIG. 4 is a circuit diagram of a portion of an analog circuit interface of the example tool.

FIG. 4 is a circuit diagram illustrating functionality of an analog pin (Ax) of the analog circuit interface 166. The circuit 136 includes a respective analog connect switch (AC_Ax) connected to an upstream power source, such as the supply voltage (Vss), a current limiting resistor (R3) and respective analog LED (LED_Ax) connected in series downstream of the analog connect switch (AC_Ax), and a respective potentiometer (POT_Ax) in parallel with the current limiting resistor (R3) and LED (LED_Ax). The middle terminal of the potentiometer (POT_Ax) is connected to the respective analog pin (Ax) and additional circuitry (ADCx, where x indicates the number of the individual additional circuitry) configured to measure voltage at the analog pin (Ax).

The analog connect switches (AC_Ax) can be used to apply or disable voltage out of the potentiometer (POT_Ax). If the analog connect switch (AC_Ax) is closed (and the analog connect LED LED_Ax is on), the analog pin (Ax) can function as a variable voltage output. As illustrated, the voltage signal output on analog pin (Ax) is determined based on the position of the middle terminal of the potentiometer (POT_Ax). Magnitude of voltage on the analog pin (Ax) can be adjusted by turning the potentiometer (POT_Ax). The potentiometer acts as a voltage divider such that when the middle terminal is positioned at the top of the potentiometer resistor (top being in relation to the orientation of FIG. 4) the analog pin (Ax) voltage is approximately equal to the upstream power source, such as the supply voltage (Vss); when the middle terminal is positioned at the bottom of the potentiometer resistor the analog pin (Ax) voltage is approximately equal to the ground potential (as indicated by the ground symbol in the circuit diagram); and the analog pin (Ax) voltage is in between the upstream power source, such as the supply voltage (Vss) and ground potential when the middle termination is between the top and bottom of the potentiometer resistor.

The voltage source, such as the supply voltage (Vss), can be the same or different voltage source for the digital circuit interface 162 as illustrated in FIG. 3. The magnitude of the voltage from the voltage source of the analog circuit interface 166 can be the same or different as the supply voltage (Vss) of the digital circuit interface 162. For many applications, it can be sufficient for the analog pins (Ax) to share a common voltage source (Vss) with each other, but they need not share a common voltage source (Vss).

When the analog connect switch (AC_Ax) is open, and the potentiometer (POT_Ax) is set so that there is sufficient resistance between the analog pin (Ax) and the ground potential, the analog pin (Ax) can be used as an input to read an external voltage source (e.g. a sensor).

As illustrated in FIG. 1, the analog connect switches (AC_Ax) may be arranged in a single row of four DIP switches, with switch numbering from 0 to 3, connected to analog pins A0 to A3. The analog pin (Ax) connected to each analog connect switch (AC_Ax) can be indicated on the PCB 132 and/or the components 118, 120 and is provided in Table 3. The potentiometers (POT_Ax) are discrete components arranged in a row adjacent the DIP switches. Analog connect switches (AC_Ax) and potentiometers (POT_Ax) can be otherwise configured as understood by a person skilled in the pertinent art. Specifically, analog connect switches (AC_Ax) and potentiometers (POT_Ax) can be a single component rather than multiple discrete components.

TABLE 3

Analog Connect switch and Analog Pin connections.

| Switch | Pin |
|---|---|
| Switch 1 | A0 |
| Switch 2 | A1 |
| Switch 3 | A2 |
| Switch 4 | A3 |

As illustrated, the potentiometers (POT_Ax) can be used to provide up to 4 analog outputs to an external system. The potentiometer results in a voltage divider circuit, with the middle node connected and providing voltage to the (Ax) pins.

The analog circuit interface 166 can further include a sensor pad 116 or other connection means for connecting to external components such as sensors. As illustrated in FIG. 1, the sensor pad 116 is located near a right edge of the PCB 132 between the on-board display 106 and the row 120 of potentiometers (POT_Ax). The sensor pad 116 can additionally, or alternatively, include other means of connecting wires, pins, or otherwise making connection to an external circuit, sensor, electrical component, etc. as understood by a person skilled in the pertinent art. In some examples, the sensor pad 116 can include 2.54 mm spaced 5×4 through-holes, on which components of certain types of sensors can readily be mounted and/or soldered.

Figure 5A:
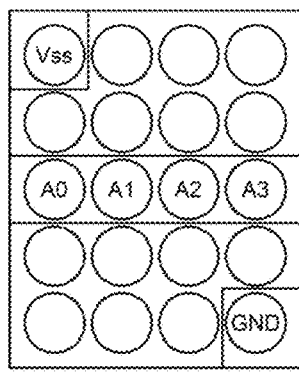
FIGS. 5A through 5E are diagrams of example sensor pad configurations of the analog circuit interface.

FIG. 5A illustrates a layout of the sensor pad 116. The sensor pad 116 includes a solderable connection to a voltage source (Vss), which can be the same or different voltage source (Vss) supplied to the digital circuit interface 162 and/or to some or all of the analog pins (Ax). The sensor pad 116 includes a solderable connection to a ground potential (GND), which preferably is the same ground potential as the analog pins (Ax) but need not be. The sensor pad 116 includes four solderable connections to the individually connected to the four analog pins (Ax).

FIGS. 5B through 5E illustrate examples of analog voltages applied to the analog pins (Ax) via connections at the sensor pad 116. The sensor pad 116 therefore enables customization of on-board circuitry of the analog circuit interface 166. The examples presented in FIGS. 5B through 5E can be realized as illustrated or via connections at the header 126 including the analog pins (Ax) and adjacent header 124 including voltage source pins (3.3V, 5V, VIN) and ground pin (GND). Soldering circuits at the sensor pad 116 can provide a more robust and/or compact option compared to connecting the same circuits at the headers 124, 126.

In general, sensor circuits often require passive components such as resistors, capacitors, thermistors, light dependent resistors, etc. The sensor pad 116 can be configured so that such passive components can be vertically mounted, with one lead curved at 180° and leads of component soldered to adjacent through-holes. When the passive components are vertically mounted as such, they can occupy a footprint including the through-holes and space between the through-holes. Adjacent through-holes can be electrically connected together ("shorted") with solder on the underside of the PCB 132.

Figure 5B:
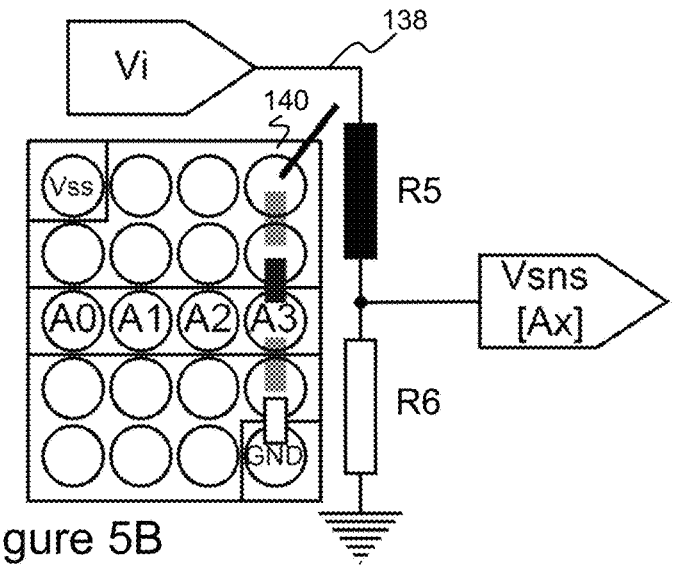

FIG. 5B illustrates one customizable sensor measurement configuration using the sensor pad 116. In some examples, the analog circuit interface 166 can be limited, absent additional circuitry such as illustrated in FIG. 5B, to sensing voltages up to 5 V or 3.3V. Sensing limits of analog voltage may be based on the voltage of the voltage source (Vss)

and/or the voltage reference pin (AREF). To enable measurement of higher voltages, the sensor pad 116 can be used to set up a sense circuit with a voltage divider. The upper limit of higher voltage measurements enabled by the voltage divider can be determined based on general circuit design considerations such as user safety and ratings of component parts associated with the tool 100 and the analog circuit interface 166. In examples where the analog circuit interface 166 is limited to sensing voltages of 5V or less (absent additional circuitry) it can be preferable to limit higher voltage measurements, enabled by the voltage divider, to 12V, 24 V, 48V, etc.

As illustrated in FIG. 5B, an input voltage (Vi) is linearly scaled down through a resistor divider circuit including a pull up resistor (R5) and a pull down resistor (R6). The value of the sensed voltage (Vsns) is determined based on the value of the input voltage (Vi) multiplied by R6/(R5+R6), based on values of the resistors (R5, R6). The sensed voltage (Vsns) is connected to an analog pin (A3) (although it may be connected to any analog pin Ax) and measured in the associated channel to be displayed by the display interface 160. In examples where the analog circuit interface 166 is limited to sensing voltages of 5V or less (absent additional circuitry) it can be preferable to use pull down resistor (R6) values on the order to 10s of kiloohms ("kΩ"), with the pull up resistor (R5) chosen as needed to scale the sense voltage (Vsns) down to 5V or less according to the limits of the analog circuit interface 166.

In the sensor pad 116, the circuit 138 is mounted in a right most column 140 of the sensor pad 116 having first, second, third, fourth, and fifth through-hole as numbered from top to bottom. A wire carrying the input voltage (Vi) is soldered to the first through-hole. The first through-hole is shorted to the second through-hole (for instance with solder on the back of the PCB 132). The pull up resistor (R5) is soldered at the second through-hole and the third through-hole. The third through-hole is hardwired, in the analog circuit interface 166 to an analog pin (A3). The third through-hole is shorted to the fourth through-hole. The pull down resistor (R6) is soldered at the fourth through-hole and the fifth through-hole. The fifth through-hole is hardwired, in the analog circuit interface 166, to the ground potential (GND) of the analog pin (A3).

Figure 5C:
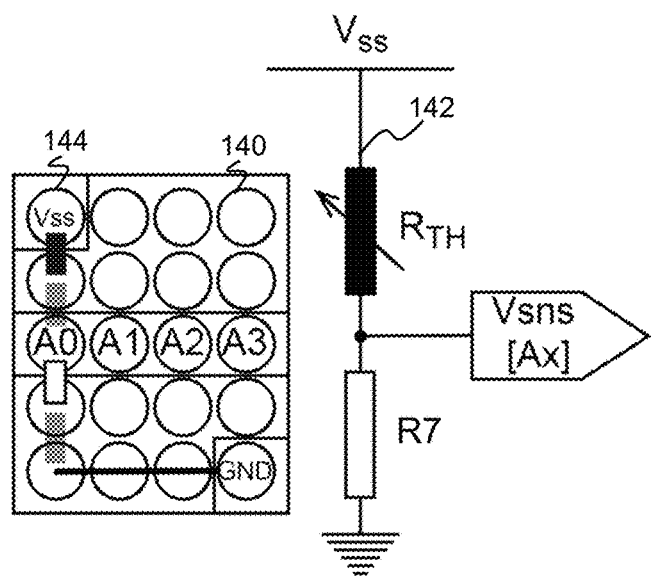

FIG. 5C illustrates another customizable sensor measurement configuration using the sensor pad 116. As with the voltage sensor circuit 138 illustrated in FIG. 5B, a temperature sense circuit 142 illustrated in FIG. 5C can be configured similarly (as a voltage divider) using a thermistor (RTH). The temperature sense circuit 142, along with one possible mounting configuration, is shown in FIG. 5C. In the sensor pad 116, the temperature sense circuit 142 is mounted primarily in a left most column 144 of the sensor pad 116 having first, second, third, fourth, and fifth through-holes as numbered from top to bottom. As illustrated, the thermistor (RTH) is soldered to the first and second through-holes of the left most column 144. The first through-hole is hardwired to a voltage source (Vss) of the analog circuit interface 166. The second through-hole is shorted to the third through-hole. The third through-hole is hardwired to analog pin (A0) of the analog circuit interface 166. A pull-down resistor (R7) is soldered at the third through-hole and the fourth through-hole. The fourth through-hole is shorted to the fifth through-hole. The fifth through-hole is shorted with solder or connected by a jumper wire or other electrical connection to the fifth through-hole in the right most column 140 of the sensor pad 116, which is in turn hardwired to a ground potential (GND).

Configured as such, the connected analog pin (A0) is configured to receive a sense voltage (Vsns), where the sense voltage (Vsns) is equal to Vss×R7/(R7+RTH).

Thermistors (and therefore the resulting Vsns values) typically vary nonlinearly with temperature. In some examples, the analog pin (A0) can be in communication with the microcontroller circuit interface 168 such that a sense voltage value (Vsns) can be transmitted to the microcontroller circuit interface 168, and the microcontroller circuit interface 168 can return a temperature value based on the sense voltage value (Vsns). The analog pin (A0) can receive a voltage value from the sensor pad 116. The received voltage can be read by the analog circuit interface 166, digitized by the processor 115, and stored in memory (of processor chip 114). A central software module can then send the stored memory value to the microcontroller circuit interface 168. The microcontroller circuit interface 168 can then transmit the stored value to an external system which calculates the temperature value and sends the temperature value back to the microcontroller interface 168.

The temperature value can then be transmitted to the display interface 160. The display interface 160 can be configured to display the temperature value on the on-board display 106 as one of the user variable channels (Ux). Configured as such, the sense voltage (Vsns) value can be displayed on the analog channel (A0) on the on-board display 106 and the temperature value can be displayed on the user variable channel (e.g. U0) on the on-board display 106. Proper calculation of the temperature value based on the sense voltage (Vsns) value can be confirmed by comparing the respective values displayed by the on-board display 106 to a datasheet table of the thermistor (RTH).

Figure 5D:
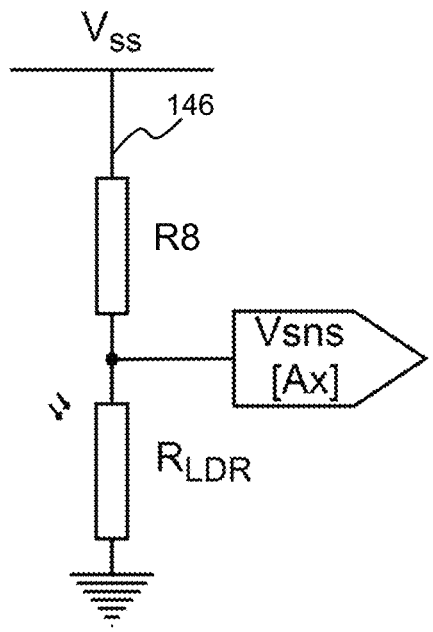

FIG. 5D illustrates another customizable sensor measurement configuration using the sensor pad 116. A light sensor circuit 146 can be set up in a manner very similar to the temperature sense circuit 142 (i.e. as a voltage divider), using Light Dependent Resistor ("LDR"), with an associated LDR resistance value (RLDR). As illustrated, the LDR resistance (RLDR) is connected to the ground potential (GND) and an analog pin (Ax). The a pull up resistor R8 is connected to the analog pin (Ax) and the voltage supply (Vss), resulting in the analog pin (Ax) carrying the sensed voltage (Vsns) equal to Vss×RLDR/(R+RLDR). Resistance of LDRs (and therefore the resulting voltage values Vsns) typically vary nonlinearly with illuminance. In some examples, the tool 100 can be configured to display a calculated illuminance value, at a user variable channel (Ux), based on the value of the sensed voltage (Vsns) similar to as described in relation to FIG. 5C.

Figure 5E:
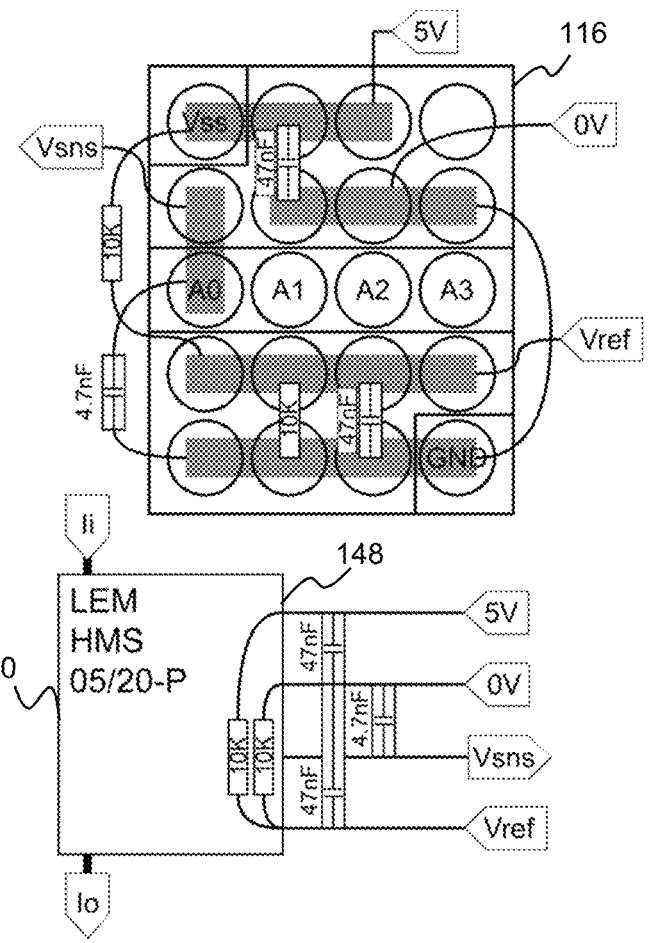

FIG. 5E illustrates another customizable sensor measurement configuration using the sensor pad 116. A Hall effect current sensor circuit 148 is connected to an analog pin (A0) via the sensor pad 116. The example includes an LEM HMS 5-P or an LEM HMS 20-P sensor 150 with associated passive components. In the example, the hardwired source voltage (Vss) at the sensor pad 116 is 5V. The Hall effect current sensor circuit 148 allows for current entering the sensor 150 at a current input (Ii) and leaving the sensor 150 at a current output (Io) to be sensed. In the present example, the current through the sensor 150 can be measured within a range of ±15 Amperes ("A") to ±60 A, depending on the sensor model used, such that at 0 A, the sensed voltage (Vsns) is 2.5 V. As illustrated, a 50% voltage divider is used to provide a reference voltage (Vref) of 2.5 V. The gray rectangles represent through-holes on the sensor pad 116 shorted together by solder and the curved black lines represent wire leads of the various components. The 4.7 nano Farad ("nF") and 47 nF capacitors are used for signal conditioning as recommended in the sensor's datasheet and in which additional information about the sensor can be obtained. In the mounting configuration shown, the sense voltage (Vsns) is connected to an analog pin (A0).

Microcontroller Circuit Interface 168

The microcontroller circuit interface 168 includes functionality to communicate and transfer data between the tool 100 and an external system or microcontroller. This functionality can enable several features, including, but not limited to, a feature for a) the user to transmit data from an external microcontroller to be displayed on the on-board display 106, b) remotely selecting, via the external microcontroller, the channel being measured and/or displayed at the tool 100, c) transmitting values measured by the tool 100 to the external microcontroller based on the channel being displayed on the on-board display 106, or any combination thereof.

As illustrated in FIG. 1, the microcontroller circuit interface 168 includes communication pins (SCL, SDA) on a header 102 near the upper left corner of the PCB 132. In some examples, the microcontroller circuit interface 168 is configured to communicate with the external system or microcontroller through an I2C communication channel through the communication pins (SCL, SDA). Configured as such, the external system or microcontroller can act as the master and the tool 100 as the slave. The tool 100 can have a predetermined slave address (e.g. 9).

Figure 6:
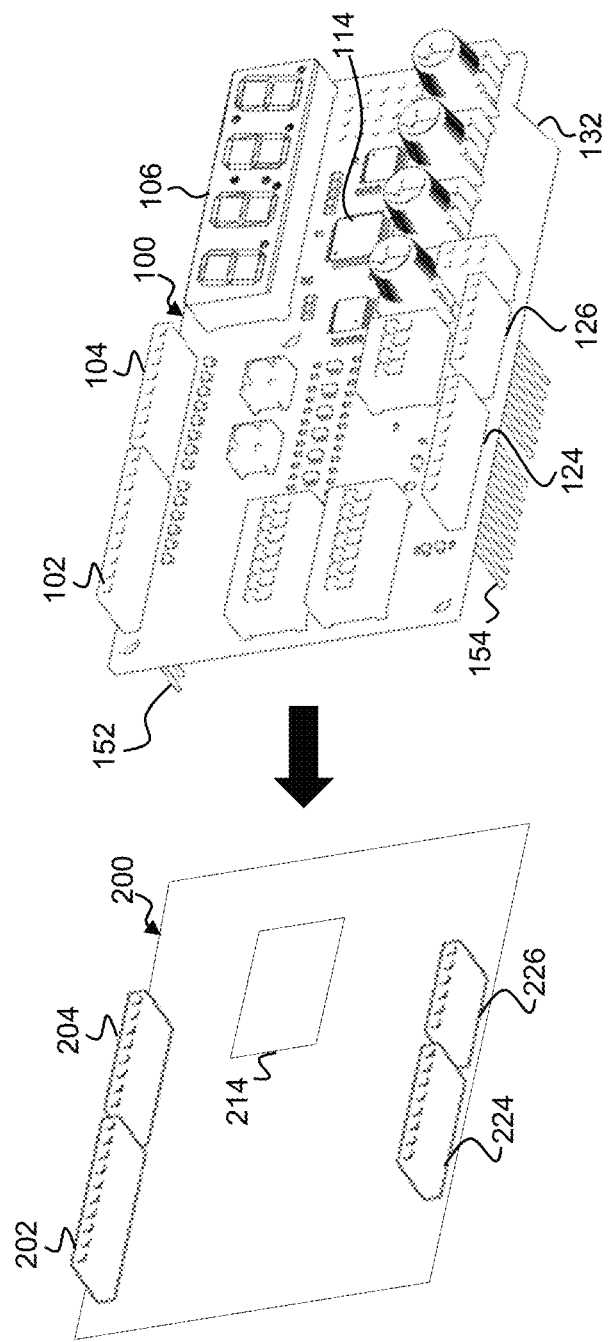
FIG. 6 is an illustration of the tool configured to mate with a microcontroller developer board.

FIG. 6 illustrates the tool 100 being configured to mate with an external microcontroller board 200. The external microcontroller board 200 includes a processor 214 configured to execute computer readable instructions (e.g. software). The microcontroller circuit interface 168 can facilitate communications between the processor 115 of the tool 100 and the processor 214 of the external microcontroller board 200.

The tool 100 can include pins 152, 154 extending from the bottom of the PCB 132 from the headers 102, 104, 124, 126. The pins 152, 154 can be positioned, sized, and otherwise configured to be inserted or otherwise make electrical contact with pins of headers 202, 204, 224, 226 of the external microcontroller board 200. As illustrated, when mated, the tool 100 is stacked on top of the external microcontroller board 200 with pins 152, 154 of the tool 100 inserted into the headers 202, 204, 224, 226 of the external microcontroller board 200.

Having a pin configuration as illustrated FIGS. 1 and 5, the tool 100 is configured to mate with an external microcontroller board 200 such as the Arduino Uno, or other Arduino-compatible board. Digital pins (Dx) of the digital circuit interface 162 of the tool 100 can function as inputs or outputs to corresponding digital pins of the Arduino-compatible external microcontroller board 200. Some of the digital pins (D3, D5, D6, D9, D10, D11) can additionally function as waveform pins to receive PWM signals output from the Arduino-compatible external microcontroller board 200. Analog pins (Ax) of the analog circuit interface 166 of the tool 100 can function as inputs or outputs to corresponding analog pins of the Arduino-compatible external microcontroller board 200. Communication pins (SCL, SDA) can provide a communication path to corresponding IC2 pins of the Arduino-compatible external microcontroller board 200. Power and voltage reference pins (3.3V, 5V, AREF, VIN, GND) of the tool can receive power and/or reference voltages from corresponding pins of the Arduino-compatible external microcontroller board 200.

The tool 100 can further include pass-through pins as illustrated on headers 124, 126 near the lower edge of the PCB 132 which can allow access to the associated pins of the Arduino-compatible external microcontroller board 200 for other measurements or functionality. The Arduino-compatible external microcontroller board 200 may receive and/or output voltages at the pass-through pins. The microcontroller circuit interface 168 on the tool 100 may receive values from the Arduino-compatible external microcontroller board 200 relating to the pass-through pins, and the display interface 160 can display those values on the user variable channels (Ux) on the on-board display 106.

In some examples, the Arduino-compatible external microcontroller board 200 can be configured to communicate other values such as calculations based on measurements at one or more of the digital pins (Dx), analog pins (Ax), and/or waveform pins. The communicated values can be received by the microcontroller circuit interface 168 via the communication pins (SCL, SDA). The values can be displayed by the display interface 160 on the on-board display 106 on a user variable channel (Ux).

In examples where the tool 100 is mated, or the microcontroller circuit interface 168 is otherwise connected, to an external system having alternative communication protocols, the tool 100 can include one or more appropriate connectors in addition to, or in place of, the communication pins (SCL, SDA) illustrated as understood by a person skilled in the pertinent art. Likewise, the code for establishing a communication channel can be modified as understood by a person skilled in the pertinent art. Tables 4 through 7 include Arduino code for performing certain functions via the microcontroller circuit interface 168 of the tool 100. Similar or equivalent code can be used to achieving the functionality illustrated in Tables 4 through 7 when the tool 100 is mated to a non-Arduino-compatible external microcontroller board 200.

Table 4 includes Arduino code for initializing an I2C communication channel between the example tool 100 and Arduino-compatible external microcontroller board 200. Similar or equivalent code can be used to achieving the functionality illustrated in Table 4 when the tool 100 is mated to a non-Arduino-compatible external microcontroller board 200 as understood by a person skilled in the pertinent art according to the teachings herein.

TABLE 4

Arduino code for initializing I2C communication with tool

```
#define __address 9
#include <Wire.h>
void setup( ) {
    Wire.begin( ); // Start the I2C Bus as Master
}
```

Table 5 includes Arduino code for sending data from an Arduino-compatible external microcontroller board 200 to the tool 100 to be displayed at the on-board display 106 in user variable channels (Ux). In Table 5, "UChannel" is an integer used to identify the user variable channel (Ux) to which the data is sent (with the first channel corresponding to a value of 0), and "val" is the value of said data. Similar or equivalent code can be used to achieving the functionality illustrated in Table 5 when the tool 100 is mated to a non-Arduino-compatible external microcontroller board 200 as understood by a person skilled in the pertinent art according to the teachings herein.

TABLE 5

Function to send values to user variable channel (U1)

```
void WriteUserChannel(byte UChannel, uint16_t val)
{
   Wire.beginTransmission(_address); // transmit to tool
   Wire.write(102);          // send instruction index
   Wire.write(UChannel);     // sends variable index
   Wire.write ((val>>8 ) & 0xFF);    //sends high byte
   Wire.write(val & 0xFF);           //sends low byte
   Wire.endTransmission( );  // stop transmitting
}
The function (to write a value to channel U1) is called as:
WriteUserChannel(1,val);
delay(500);
```

Table 6 includes Arduino code for selecting which channel is displayed on the on-board display 106. The channels can be configured as outlined in Table 1. Configured as such, the "ChangeChannel(1)" function call can cause the on-board display 106 to display a numerical representation of voltage on the analog pin (A1) associated with channel number 1. Similar or equivalent code can be used to achieving the functionality illustrated in Table 6 when the tool 100 is mated to a non-Arduino-compatible external microcontroller board 200 as understood by a person skilled in the pertinent art according to the teachings herein.

TABLE 6

Function to change channel displayed

```
void ChangeChannel(byte channel)
{
   Wire.beginTransmission(_address); // transmit to tool
   Wire.write(101);          // send instruction index
   Wire.write(channel);      //sends desired channel number
   Wire.endTransmission( );  // stop transmitting
}
The function (to change to channel 1) is called as:
ChangeChannel(1);
delay(500);
```

Table 7 includes Arduino code for returning a value from the current channel of the tool 100, with an example channel configuration as outlined in Table 1, to the Arduino-compatible external microcontroller board 200.

TABLE 7

Function to return the current channel value to Arduino

```
uint16_t ReadChannel(void)
{
   uint16_t v = 0;
   //Request 2 bytes from Arcimuse
   //since channel value is always 2 bytes
   Wire.requestFrom(_address,2);
   //I2C channel has 2 bytes ready to read
   if(Wire.available( ) == 2)
   {
      v = Wire.read( ); //Read first byte into return variable
      v |= Wire.read( )<<8; //Read second byte
   }
   return v;
}
The function is called as:
uint16_t value = Readchannel( );
delay(500);
```

In the example illustrated in Table 1, the tool 100 can have ten user variable channels (Ux) and associated variables from an external microcontroller which can be received by the microcontroller circuit interface 168 and displayed by the display interface 160. The user variable channels (Ux) can be used to set up real-time watch variables for run-time and in-situ debugging. The user variable channels (Ux) can also be used to display any values available to the external microcontroller 200; these may be values obtained from other components in the system, values post-processed from sensory data, or other values calculated within the microcontroller 200. The tool 100 can include more or fewer user variable channels (Ux) as practical and within the limitations of specific hardware and software used to implement the tool 100.

Calibration Interface 174

Maintaining diagnostic equipment in calibration is a requirement in many industries and applications. Typically, equipment is routinely sent out to external facilities that are able to provide calibration certificates. However, due to cost constraints, several pieces of handheld equipment, reserved for internal use, can be calibrated less frequently by an external entity. Nonetheless, it is useful to have an internal calibration process that accounts for temperature, fatigue, and other environmental or degradation effects.

In some examples, the tool 100 can include an internal calibration process for calibrating voltage amplitude, frequency, and/or timing measurements. Several factors can affect voltage measurements, one of the most significant factors being analog-to-digital converter (ADC) conversion error. The tool 100 can include internal circuitry and software algorithm process by which the ADC can be calibrated. Frequency and timing measurements can primarily be related to the clock speed the microcontroller is operating on. Although the datasheet value of the clock speed is initially assumed, the internal oscillator can exhibit drift in frequency due to the aforementioned factors. In some examples, the tool 100 is designed to use an external square wave signal, with an accurately known frequency, to calibrate its internal clock speed value. In some examples, the calibration interface 174 can include a self-diagnostics functionality, wherein the processor 115 executes instructions in a software algorithm, pertaining to on-board circuitry, components, and/or memory, to evaluate overall health of the tool 100 and validate adequate functionality of the tool 100.

EXAMPLE ADVANTAGES

The development of any project requiring the use of electrical or electronics components typically requires a wide range of support equipment. This includes oscilloscopes, power supplies, various types of specialized meters, data loggers, a user interface panel and an LED indicator panel (both either obtained off-the-shelf or custom-built using an arrangement of breadboards, jumper wires, switches, potentiometers, resistors, capacitors, LEDs, and other passive components), etc. Collectively, this equipment is often referred to as an electronics workbench. It is noted that most of the aforementioned diagnostics equipment is not designed to be made an integral part of a given system, but an add-on used during testing and validation phases. As an example, an oscilloscope is typically used to take time-varying measurements on the workbench and is not integrated into the overall system.

In some respects, the presented tool 100 is an all-in-one unit, containing a key functionality of an oscilloscope (i.e. measurement and analysis of waveform characteristics, such as frequency and duty cycle), a digital voltmeter (measuring voltage levels), an LED annunciator or indicator panel, a user interface panel (with an on-board display, switches, knobs, and push-buttons), and a data acquisition system ("DAQ"). When combined with accessory sensors placed on its sensor pad 116, the tool 100 can be converted into numerous types of specialized meters, including a current meter, a light meter, a flux meter, a high-voltage meter, a temperature meter, and so forth. Finally, specialized features in the tool 100 include its self-calibration functionality, as well as the ability to communicate with an external microcontroller board 200, such as to read Display and Watch variables from a microcontroller.

In the past decade or so, Arduino and other similar products (UDOO, Raspberry Pi, TI LaunchPad, STM Nucleo, BeagleBone, etc.) have created a user base of electronics developers and hobbyists working on a very large variety of projects (e.g. networked objects in your home/Internet-of-Things), and on a budget. These tools provide a viable, low-cost option for users to make things intelligent using microcontrollers. Although the exact implementation of each product varies, generally, each product includes a circuit including a processor, headers connected to analog and/or digital inputs and outputs of the circuit, and a computer interface to upload software to control the circuit. Generally, an aim of such products is to provide a highly configurable low cost computing device.

However, although these platforms can facilitate the use of microcontrollers in low-cost, DIY, and/or home-based projects, often expensive and/or cumbersome electronics workbench equipment is required to debug hardware and software developed with the microcontrollers. In some implementations of some examples, the tool 100 can reduce the cost, complexity, and development time associated to diagnostics, debugging, building user-interfaces, reducing bread-boarded circuitry, etc., typically required in these projects. In such a case, the tool 100 can be thought of as the at-home electronics workstation that replaces the ring of standard workbench tools surrounding the project under development.

The tool 100 can function as a cost-effective, hand-held diagnostics and educational workstation that inspires rapid and economical debugging sessions. It can facilitate incorporating industry best-practices easily, like the V-Model Development Cycle, on a scale accessible to hobbyists and educators by removing the burden of building, maintaining, and debugging complex diagnostics and breadboard-based systems to physically interact with microcontrollers.

For experienced developers, the tool 100 can provide functionality of a suite of typical electronics tools including a voltmeter (or other specialized meters), a user interface panel, an LED annunciator panel, and some waveform analysis capability similar to that of an oscilloscope, all for a fraction of the cost of such tools. In addition, the tool 100 can be configured to continuously monitor and display memory variables without a computer, enabling rapid runtime and in-situ debugging.

In some examples, the tool's headers, pinout, and form-factor can be tailored to allow the tool 100 to mate directly onto an Arduino, STM Nucleo, UDOO, or other similar microcontroller or minicomputer as well as other boards or shields configured to mate with such systems. Even without being tailored to mate with such systems, the tool 100 can be connected to using jumper wires or adapters. As a complimentary tool, the tool 100 can provide on-board resources for measuring signals, applying signals, and a physical interface to allow novice or experienced developers to manually interact with their microcontroller or minicomputer platform.

In some examples, the tool 100 can enable Hardware-in-the-Loop ("HIL") testing methodology for a microcontroller, wherein the tool 100 functions as a "wrapper" for a microcontroller device under test ("DUT"). Similar to software wrappers, the tool 100 can drive various inputs and read various outputs for the microcontroller. In so doing, the device under test can be rigorously tested and its behavior verified before being incorporated into the larger system.

Further, the tool 100 need not be mated or connected to such a microcontroller or minicomputer system to be useful. The tool 100 can be powered independently and replace most often used functionality of several typical electronics workbench tools.

The tool 100 can incorporate several restrictions on various technical implementation aspects to reduce cost. Some design restrictions can be aimed at a highly manufacturable process including, but not limited to: (a) requiring an upper limit on PCB size (to approximately 100×100 mm, approximately 150 mm corner to corner, maximum linear dimension); (b) limiting number of PCB trace layers (e.g. to 2 or fewer); (c) using single-sided parts on PCB (with components only on one side); (d) requiring a lower limit on pad sizes (e.g. to 0402); (e) requiring a lower limit on via or hole sizes (e.g. 0.3 mm); (f) requiring lower limits on (i.e. higher tolerance error levels for) wire traces and spacing (to 6 mil each); (g) utilizing most standard board thickness of 1.6 mm (limiting maximum voltage between layers); (h) overall copper thickness limit of 1 oz per square foot (thereby limiting maximum current); (i) minimizing number of through-hole components (i.e. maximizing surface-mount components). In the above, (a)-(c) can result in a reduced amount of available real estate in which all circuitry is implemented, while (d)-(f) can require increased real-estate (both facilitating the need for a highly efficient use of space). Combined with the technical needs pertaining to EMC and EMI issues (e.g. reducing trace loops with a minimum amount of real estate), a significant aspect of the implementation challenges are addressed by efficient design in the PCB layout of the tool, with circuit design also contributing significantly.

Cost reduction may also be realized by using low-cost readily available components including: (a) simple DIP switches, push-buttons, potentiometers: instead of more expensive buttons and knobs typically present on oscilloscopes, power supplies, etc.; (b) a low-end microcontroller with reduced cost and limited on-chip resources, such as the AVR ATtiny®, megaAVR®, Arm Cortex®, or similar types of microcontrollers; (c) on-board 7-segment display: this is one of the oldest, most common, and readily available types of digital displays; (d) minimizing unique part count; and (e) minimizing overall part count.

Using the low cost microcontroller led to development of efficient methods for structuring the software framework, to execute the measurement and computational loads for analyzing waveforms and filtering measured values within the available processing power. In one implementation, an AUTOSAR structure for software framework is used, which is typically used in automotive Electronics Control Units (ECUs). In this implementation, the software framework and the context menu presented in Table 1 are stored in the on-board memory of the low cost microcontroller.

Compared to other modern displays (TFT, OLED, etc.) there are several drawbacks to using a 7-segment display. The 7-segment display is not multicolor, can only display certain types of digits, cannot display any type of images, and is limited to 4 digits and a decimal point. Although comparatively cost-effective, these limitations make the 7-segment display extremely challenging to use in a modern diagnostic tool. In some implementations, the tool has been designed and implemented to allow efficient and intuitive methods for the user to navigate the context menu (Table 1), while simultaneously allowing the various types of text and numerical data to be displayed in a manner that the user interaction does not feel outdated (i.e. from the 1970s or 1980s).

Minimizing unique part count can be realized by reusing components as often as possible, even though an idealized version of the design may have included a different type or value of the component. In one example, because an idealized design required a large number of 1.1K resistors, other circuits were redesigned to use the same resistances.

Minimizing overall part count can be realized by relying on a software solution over a hardware solution. In one example, although an idealized design called for a number of additional parts (e.g. a bank of capacitors to reduce noise), the circuitry was redesigned to remove components and address the resulting issues by other means (e.g. reducing noise by software filtering).

Cost reduction can also be realized by targeting only key functionality of expensive test equipment, such as: (a) utilizing an LED annunciator panel to read digital high or low outputs when possible; (b) limiting capability to key waveform analysis and characteristic measurements (instead of displaying the time-varying waveform); (c) an essential level and precision of voltage measurements; (d) a simplified user interface; and (e) the capability of communication with an external microcontroller board 200.

One of the most common uses for a multi-meter or an oscilloscope during early development phases is to determine whether a voltage is present on a specific pin or wire. The LED panel allows this to be determined simultaneously on 14 pins, removing time associated to constantly repositioning probes, purchasing an annunciator panel, or custom building such a panel.

The waveform display functionality of an oscilloscope significantly increases hardware cost. However, one of the most common uses (perhaps the primary use) of an oscilloscope during early phase development is to determine the magnitude, frequency, or duty cycles of various period signals.

Measuring voltage magnitude is a highly common use of typical workbench equipment, particularly in early design stages. Further, voltage measurement functionality enables measurements of a number of other values with an appropriate sensor, including current, flux, light, temperature, etc. While a number of specialized meters (e.g. Fluke®) exist for high-accuracy measurements of these types of phenomena, the sensor pad 116 combined with the voltage measurement feature of the tool 100 allows for these various types of measurements with a reasonable degree of accuracy as required for many common applications.

A user interface typically needs to be able to apply inputs, including discrete (either as position switches or push-buttons) or continuous (like potentiometer knobs) values, and display outputs, including alphanumeric values (as in the on-board display 106) or status flags (as in the LED indicators, LED_Dx, LED_Ax). A variety of user interface applications can be built on these key features present on the tool 100.

Ability of the microcontroller circuit interface 168 to communicate with an external microcontroller enables several possible applications, including the use of real-time watch variables from the external microcontroller, access to measured data from the tool 100 in-situ, as well as applications using combinations of these bidirectional features.

Using standard electronics workbench equipment, measurement data from diagnostics equipment and other data acquisition systems is typically only available during the development and prototype validation phases, when the device or system being designed is set up on a test bench (and not during run-time), as such equipment substantially increases the cost and complexity of the system. When measured data is required during run-time, specific systems need to be designed and integrated into the overall system, increasing development cost and time.

In some examples, the tool 100 can function as a data acquisition system that can send measured data values to an external microcontroller board 200. As illustrated in FIG. 6, if working with a compatible platform, the tool 100 can be physically mounted and mechanical secured directly onto the external microcontroller board 200. Consequently, the tool 100 and external microcontroller board 200 can function as a data-logger, allowing the external microcontroller board 200 to use data acquired by the tool 100 to make real-time decisions in-situ. In some examples, certain design features have been implemented to dramatically reduce the power draw from the system (including using high-efficiency, low-current LEDs) to further facilitate integration of the tool 100 with an external system 200.

When debugging microcontroller systems, especially those that are mobile or portable, a common need during product development is access to real-time variable data (similar to the use of "watch" variables in software development). In some examples, the tool 100 can be configured to function as a hardware-level real-time "watch" variable system that can aid a programmer in early development, writing, and debugging of embedded code. While integrated development environments ("IDEs") for writing such codes (e.g. Atmel, Microchip, etc.) can allow for watch variables, these watch variables are not available in "real-time" as tracing a particular variables behavior over, say, 1 min of "real-time", might require stepping through several million clock cycles worth of code, resulting in a large and impractical "run-time". In some examples, the tool 100 is equipped with a watch and display variable feature, which can read selected data from memory of an external microcontroller (via the microcontroller circuit interface 168) and display the selected data in the appropriate channel on the on-board display 106.

In some examples, the tool 100 can include an internal calibration process for calibrating voltage amplitude, frequency, and/or timing measurements. Such calibration functionality can provide a convenient alternative to a process that is normally, on typical electronics workbench equipment, performed manually by the equipment owner or by a third party. Several factors can affect voltage measurements, one of the most significant factors being analog-to-digital converter (ADC) conversion error. The tool 100 can include internal circuitry and software algorithm process by which the ADC can be calibrated. Frequency and timing measurements can primarily be related to the clock speed the microcontroller is operating on. Although the datasheet value of the clock speed is initially assumed, the internal oscillator can exhibit drift in frequency due to the aforementioned factors. In some examples, the tool 100 is designed to use an external square wave signal, with an accurately known frequency, to calibrate its internal clock speed value.

Using Arduino-based project development as a non-limiting example, as a result of some or all of the above features, it is possible for the user to proceed through a complete Arduino-based project development program without the need for: (a) creating custom assemblies of breadboards, toggle switches, potentiometers, displays, wiring, etc.; (b) detailed electrical engineering knowledge to set the hardware up appropriately; (c) the purchase of expensive equipment (e.g. voltmeters, oscilloscopes, etc.); and/or (d) spending significant debugging time/overhead in the product development process.

Additionally, the tool can allow diagnostics to be conducted in a run-time environment, without the need for a computer to be connected to the Arduino (or other similar system/microcontroller), especially once the "watch variables" have been set up to read variables from the microcontroller memory. In general, all inputs to an Arduino can be "simulated" using the illustrated example tool 100, and the output response read from the on-board sensory systems. Once connected to an Arduino or similar microcontroller, the tool 100 can enable the user to get up and running almost immediately, out-of-the-box, and in a "plug-and-play" sense, without detailed knowledge of how to assemble various subsystems (e.g. potentiometers, LEDs, display systems, frequency analyzers, etc.) together.

To facilitate an understanding of the principles and features of the present invention, various illustrative embodiments are presented herein. The components, steps, and materials described hereinafter as making up various elements of the invention are intended to be illustrative and not restrictive. Many suitable components, steps, and materials that would perform the same or similar functions as the components, steps, and materials described herein are intended to be embraced within the scope of the invention. Such other components, steps, and materials not described herein can include, but are not limited to, similar components or steps that are developed after development of the invention.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art to which this application pertains will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

What is claimed is:

1. An electronics tool comprising:
   a waveform interface integral to the electronics tool and comprising a waveform pin configured to make electrical contact with a system external to the electronics tool, the waveform interface being configured to measure a frequency and a duty cycle of a pulse width modulated electrical signal on the waveform pin;
   an analog circuit interface integral to the electronics tool and comprising an analog pin configured to make electrical contact with a system external to the electronics tool, the analog circuit interface being configured to provide an adjustable analog output at the analog pin, receive an analog input at the analog pin, and measure a magnitude of a voltage at the analog pin; and
   a digital circuit interface integral to the electronics tool and comprising a mechanical switch and a digital pin, the digital pin being configured to make electrical contact with a system external to the electronics tool, and the digital circuit interface being configured to provide a digital output at the digital pin based at least in part on a position of the mechanical switch and receive a digital input at the digital pin.

2. The electronics tool of claim 1,
   wherein the analog circuit interface further comprises an analog connect switch, and
   wherein functionality of the analog pin toggles between an input and an output based at least in part on a position of the analog connect switch.

3. The electronics tool of claim 1, further comprising:
   a processor having a clock speed,
       wherein the electronics tool is configured to calibrate the clock speed based on an external square wave signal.

4. An electronics tool comprising:
   a waveform interface integral to the electronics tool and comprising a waveform pin configured to make electrical contact with a system external to the electronics tool, the waveform interface being configured to measure a frequency, an amplitude, and/or a duty cycle of an electrical signal on the waveform pin;
   an analog circuit interface integral to the electronics tool and comprising an analog pin configured to make electrical contact with a system external to the electronics tool, the analog circuit interface being configured to provide an adjustable analog output at the analog pin, receive an analog input at the analog pin, and measure a magnitude of a voltage at the analog pin;
   a digital circuit interface integral to the electronics tool and comprising a mechanical switch and a digital pin, the digital pin being configured to make electrical contact with a system external to the electronics tool, and the digital circuit interface being configured to provide a digital output at the digital pin based at least in part on a position of the mechanical switch and receive a digital input at the digital pin; and
   a display interface integral to the electronics tool and configured to display an analog voltage value based on the magnitude of the voltage at the analog pin and display a visual indication of the digital pin being at a high voltage or a low voltage, wherein the display interface comprises a light configured to illuminate when the digital pin is at the high voltage and darken when the digital pin is at the low voltage.

5. An electronics tool comprising:
   a waveform interface integral to the electronics tool and comprising a waveform pin configured to make electrical contact with a system external to the electronics tool, the waveform interface being configured to measure a frequency, an amplitude, and/or a duty cycle of an electrical signal on the waveform pin;
   an analog circuit interface integral to the electronics tool and comprising an analog pin configured to make electrical contact with a system external to the electronics tool, the analog circuit interface being configured to provide an adjustable analog output at the analog pin, receive an analog input at the analog pin, and measure a magnitude of a voltage at the analog pin;

a digital circuit interface integral to the electronics tool and comprising a mechanical switch and a digital pin, the digital pin being configured to make electrical contact with a system external to the electronics tool, and the digital circuit interface being configured to provide a digital output at the digital pin based at least in part on a position of the mechanical switch and receive a digital input at the digital pin; and a display interface integral to the electronics tool and configured to display an analog voltage value based on the magnitude of the voltage at the analog pin and display a visual indication of the digital pin being at a high voltage or a low voltage, wherein the display interface comprises one or a plurality of mechanical buttons, and wherein the display interface is configured to toggle between displaying a value associated with the analog input at the analog pin, the frequency or frequencies of the electrical signal on the waveform pin, the amplitudes of the electrical signal on the waveform pin, and/or the duty cycle of the electrical signal on the waveform pin in response to one or more presses of the mechanical button(s).

6. An electronics tool comprising:

a waveform interface integral to the electronics tool and comprising a waveform pin configured to make electrical contact with a system external to the electronics tool, the waveform interface being configured to measure a frequency, an amplitude, and/or a duty cycle of an electrical signal on the waveform pin;

an analog circuit interface integral to the electronics tool and comprising an analog pin configured to make electrical contact with a system external to the electronics tool, the analog circuit interface being configured to provide an adjustable analog output at the analog pin, receive an analog input at the analog pin, and measure a magnitude of a voltage at the analog pin;

a digital circuit interface integral to the electronics tool and comprising a mechanical switch and a digital pin, the digital pin being configured to make electrical contact with a system external to the electronics tool, and the digital circuit interface being configured to provide a digital output at the digital pin based at least in part on a position of the mechanical switch and receive a digital input at the digital pin;

a microcontroller circuit interface integral to the electronics tool and comprising communication pins configured to make electrical contact with a system external to the electronics tool, the microcontroller circuit interface being configured to communicate with an external processor of the system external to the electronics tool that is in electrical contact with the communication pins; and a display interface integral to the electronics tool, wherein the microcontroller circuit interface is further configured to receive a transmitted value from the external processor and communicate the transmitted value to the display interface, and wherein the display interface is further configured to display the transmitted value.

7. The electronics tool of claim 6, further comprising:
a processor; and
non-transitory computer readable medium in communication with the processor of the electronics tool and comprising instructions thereon that when executed by the processor of the electronics tool cause the electronics tool to:
receive the magnitude of the voltage at the analog pin,
cause an alphanumeric representation of the magnitude of the voltage at the analog pin to be displayed at the display interface,
receive the transmitted value from the external processor, and
cause an alphanumeric representation of the transmitted value to be displayed at the display interface.

8. The electronics tool of claim 7, wherein the non-transitory computer readable medium further comprises instructions thereon that when executed by the processor of the electronics tool cause the electronics tool to:
sense a temperature of the electronics tool, and
cause an alphanumeric representation of the temperature to be displayed at the display interface.

9. An electronics tool comprising:

a waveform interface integral to the electronics tool and comprising a waveform pin configured to make electrical contact with a system external to the electronics tool, the waveform interface being configured to measure a frequency, an amplitude, and/or a duty cycle of an electrical signal on the waveform pin;

an analog circuit interface integral to the electronics tool and comprising an analog pin configured to make electrical contact with a system external to the electronics tool, the analog circuit interface being configured to provide an adjustable analog output at the analog pin, receive an analog input at the analog pin, and measure a magnitude of a voltage at the analog pin;

a digital circuit interface integral to the electronics tool and comprising a mechanical switch and a digital pin, the digital pin being configured to make electrical contact with a system external to the electronics tool, and the digital circuit interface being configured to provide a digital output at the digital pin based at least in part on a position of the mechanical switch and receive a digital input at the digital pin; and a printed circuit board (PCB) to which the analog circuit interface and the digital circuit interface are affixed, wherein the digital pin comprises a male connector and a female connector extending from an opposite side of the PCB from the respective male connector, and wherein the analog pin comprises a male connector and a female connector extending from an opposite side of the PCB from the respective male connector.

10. The electronics tool of claim 9, further comprising:
a first header row; and
a second header row aligned substantially parallel to the first header row at a distance of approximately 50 mm from the first header row measured orthogonal to the first and second header rows,
wherein the first and second header rows each respectively comprise linearly aligned pins each comprising a male connector and a female connector extending from an opposite side of the PCB from the respective male connector,
wherein the first header row comprises the digital pin, and
wherein the second header row comprises the analog pin.

11. An electronics tool comprising:
a waveform interface integral to the electronics tool and comprising a waveform pin configured to make electrical contact with a system external to the electronics tool, the waveform interface being configured to measure a frequency, an amplitude, and/or a duty cycle of an electrical signal on the waveform pin;
an analog circuit interface integral to the electronics tool and comprising an analog pin configured to make electrical contact with a system external to the electronics tool, the analog circuit interface being configured to provide an adjustable analog output at the analog pin, receive an analog input at the analog pin, and measure a magnitude of a voltage at the analog pin; and
a digital circuit interface integral to the electronics tool and comprising a mechanical switch and a digital pin, the digital pin being configured to make electrical contact with a system external to the electronics tool, and the digital circuit interface being configured to provide a digital output at the digital pin based at least in part on a position of the mechanical switch and receive a digital input at the digital pin,
wherein the analog circuit interface further comprises a first solder connection electrically connected to the analog pin, a second solder connection electrically connected to a power supply pin, and a third solder connection electrically connected to a ground pin,
wherein the first solder connection, the second solder connection, and the third solder connection each respectively comprises a solder pad and/or a solderable through-hole,
wherein the analog circuit interface further comprises a grid of solder connections comprising the first solder connection, the second solder connection, the third solder connection, and additional solder connections not electrically connected within the electronics tool 100,
wherein the grid comprises a width of at least two solder connections and a length of at least three solder connections, and
wherein each solder connection in the grid of solder connections comprises a solder pad and/or a solderable through-hole.

12. An electronics tool comprising:
a waveform interface integral to the electronics tool and comprising a waveform pin configured to make electrical contact with a system external to the electronics tool, the waveform interface being configured to measure a frequency, an amplitude, and/or a duty cycle of an electrical signal on the waveform pin;
an analog circuit interface integral to the electronics tool and comprising an analog pin configured to make electrical contact with a system external to the electronics tool, the analog circuit interface being configured to provide an adjustable analog output at the analog pin, receive an analog input at the analog pin, and measure a magnitude of a voltage at the analog pin;
a digital circuit interface integral to the electronics tool and comprising a mechanical switch and a digital pin, the digital pin being configured to make electrical contact with a system external to the electronics tool, and the digital circuit interface being configured to provide a digital output at the digital pin based at least in part on a position of the mechanical switch and receive a digital input at the digital pin;
a display interface integral to the electronics tool and configured to display an analog voltage value based on the magnitude of the voltage at the analog pin and display a visual indication of the digital pin being at a high voltage or a low voltage;
a microcontroller circuit interface integral to the electronics tool and comprising communication pins configured to make electrical contact with a system external to the electronics tool, the microcontroller circuit interface being configured to receive a variable from the system external that is in electrical contact with the communication pins; and
an internal temperature sensor,
wherein the display interface comprises one or a plurality of mechanical buttons, and
wherein the display interface is configured to toggle between displaying a value associated with the analog input at the analog pin, the frequency or frequencies of the electrical signal on the waveform pin, an amplitude or amplitudes of the electrical signal on the waveform pin, the duty cycle of the electrical signal on the waveform pin, the variable received by the microcontroller circuit interface, and/or a temperature value obtained from the internal temperature sensor in response to one or more presses of the mechanical button.

* * * * *